(12) United States Patent
Chang

(10) Patent No.: US 6,738,727 B2
(45) Date of Patent: May 18, 2004

(54) SYSTEM AND METHOD FOR ANALYZING AND PROCESSING DATA ON AN OBJECT

(75) Inventor: Chih-Kuang Chang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/193,072

(22) Filed: Jul. 10, 2002

(65) Prior Publication Data

US 2003/0204366 A1 Oct. 30, 2003

(30) Foreign Application Priority Data

Apr. 30, 2002 (TW) ........................................ 91108927 A

(51) Int. Cl.[7] .................... G01B 11/24; G01B 13/16; G01B 15/04; G01B 17/06; G01B 21/20
(52) U.S. Cl. ........................ 702/167; 703/13; 700/98; 717/137; 250/208.1; 345/582; 345/420; 433/29; 382/128
(58) Field of Search .................. 702/167; 703/13; 700/98; 717/137; 250/208.1; 345/582, 420; 433/29; 382/128

(56) References Cited

U.S. PATENT DOCUMENTS

| | | | |
|---|---|---|---|
| 6,377,865 B1 * | 4/2002 | Edelsbrunner et al. | ........ 700/98 |
| 6,413,084 B1 * | 7/2002 | Rubbert et al. | ................ 433/29 |
| 6,532,299 B1 * | 3/2003 | Sachdeva et al. | ........... 382/128 |
| 2002/0120920 A1 * | 8/2002 | Jayaram et al. | ............. 717/137 |
| 2002/0158880 A1 * | 10/2002 | Williams et al. | ............ 345/582 |
| 2003/0038798 A1 * | 2/2003 | Besl et al. | .................. 345/420 |
| 2003/0066949 A1 * | 4/2003 | Mueller et al. | .......... 250/208.1 |
| 2003/0071194 A1 * | 4/2003 | Mueller et al. | .......... 250/208.1 |
| 2003/0074174 A1 * | 4/2003 | Fu et al. | ....................... 703/13 |

* cited by examiner

*Primary Examiner*—John Barlow
*Assistant Examiner*—Aditya S Bhat
(74) *Attorney, Agent, or Firm*—Wei Te Chung

(57) ABSTRACT

A system and method for analyzing and processing data on an object. The system includes: an automatic scanning and measuring subsystem (100) for obtaining point cloud data on the object by scanning the object, and generating measurement data on the object by processing the point cloud data; a graphic file receiving apparatus (150) for receiving a graphic file of the object; a dimension capturing subsystem (160) for retrieving design dimensions from the graphic file; a report generating subsystem (170) for generating a dimension report by combining the measurement data and the design dimensions; and a measurement data outputting subsystem (180) for outputting the measurement data to the graphic file.

21 Claims, 24 Drawing Sheets

SYSTEM AND METHOD FOR ANALYZING AND PROCESSING DATA ON AN OBJECT

BACKGROUND OF THE INVENTION

1. Field of the Invention

The present invention relates to systems and methods for analyzing and processing data on an object, and especially to a system and method for combining in a variety of ways measurement data on the object obtained by automatic scanning with design dimensions of the object.

2. The Related Art

In recent years, reverse engineering has been applied in a wide range of industrial design and manufacturing fields. Reverse engineering is mainly used for obtaining geometrical data on an object by analyzing and processing point cloud data on the object. Then a user can manufacture the object according to the geometrical data.

U.S. Pat. No. 5,621,648 discloses an apparatus and method for creating three-dimensional modeling data on an object. Referring to FIG. 24, the apparatus comprises a material removal means 2401, a data requisition means 2403 and an object shuttle 2405. When the object shuttle 2405 transmits the object (not shown) to a first location 2407, the material removal means 2401 cuts the object to provide an exposed surface thereof. Then the object shuttle 2405 transmits the object to a second location 2409. The data requisition means 2403 acquires data on the exposed surface. Subsequently, the object is transmitted back to the first location 2407 and back to the second location 2409 repeatedly, for successive cycles of cutting the object and acquiring data. After each exposed surface is provided, geometrical data on it is obtained, processed and recorded. By combining the geometrical data on each exposed surface, a three-dimensional electronic domain representation of the object is yielded.

However, the user sometimes wants to know the difference between the geometry of the manufactured object and the theoretical geometry of the object. Computer aided verification (CAV) can provide such information. CAV can compare a point cloud model of the object with a design model thereof, and mark difference ranges in different colors. CAV can let the user know where and how the manufactured object is different from the design model.

Even though CAV can indicate difference ranges between the manufactured object and the design object, the user sometimes needs to know exact differences. This is because the user may want to improve the quality of the manufactured object by changing production criteria and procedures. Current technology does not enable the user to obtain measurements of the manufactured object and juxtapose the measurements with design dimensions of the object for precise comparison.

SUMMARY OF THE INVENTION

A general object of the present invention is to provide a system and method for conveniently and accurately analyzing and processing data on an object, wherein measurement data on the object can be acquired from point cloud data on the object.

Another object of the present invention is to provide a system and method for analyzing and processing data on an object, wherein design dimensions of the object can be retrieved from a graphic file of the object.

A further object of the present invention is to provide a system and method for analyzing and processing data on an object, wherein a report can be automatically generated by combining measurement data on the object with design dimensions of the object.

A still further object of the present invention is to provide a system and method for analyzing and processing data on an object, wherein measurement data on the object can be readily output to a graphic file of the object.

In order to accomplish the above-mentioned objects, the present invention provides a system and method for analyzing and processing data on an object. A preferred embodiment of the system comprises: an automatic scanning and measuring subsystem for obtaining point cloud data on the object by scanning the object, and generating measurement data on the object by processing the point cloud data; a graphic file receiving apparatus for receiving a graphic file of the object; a dimension capturing subsystem for retrieving design dimensions from the graphic file; a report generating subsystem for generating a dimension report by combining the measurement data and the design dimensions; and a measurement data outputting subsystem for outputting the measurement data to the graphic file.

A preferred embodiment of the method comprises the steps of: (i) obtaining measurement data on the object by processing point cloud data on the object; (ii) receiving a graphic file of the object; (iii) retrieving design dimensions of the object from the graphic file; (iv) generating a report employing the measurement data on the object and the design dimensions of the object; and (v) outputting the measurement data to the graphic file of the object.

Other objects, advantages and novel features of the present invention will be drawn from the following detailed description of preferred embodiments of the present invention with the attached drawings, in which:

DETAILED DESCRIPTION OF PREFERRED EMBODIMENTS OF THE INVENTION

Several items described hereinafter are defined as follows:

'Figure unit' means an object forming a figure, such as a line, a circle, an angle, or a labeled design dimension of an object.

'Figure number' means a serial number of a figure unit that represents a labeled design dimension of an object.

'Unit location' means a general location of a figure number in a figure.

'Design dimension' means a number labeled beside a figure unit for representing design geometry of the figure unit, or for representing a locational relationship of figure units relative to each other.

'Unit calculating area' means an area in which figure units are taken into account for calculation. A unit calculating area can be defined by clicking a first corner and another corner in a computer graphic file.

'Data on an object' comprise measurement data on an object and design dimensions of the object.

Figure 1:
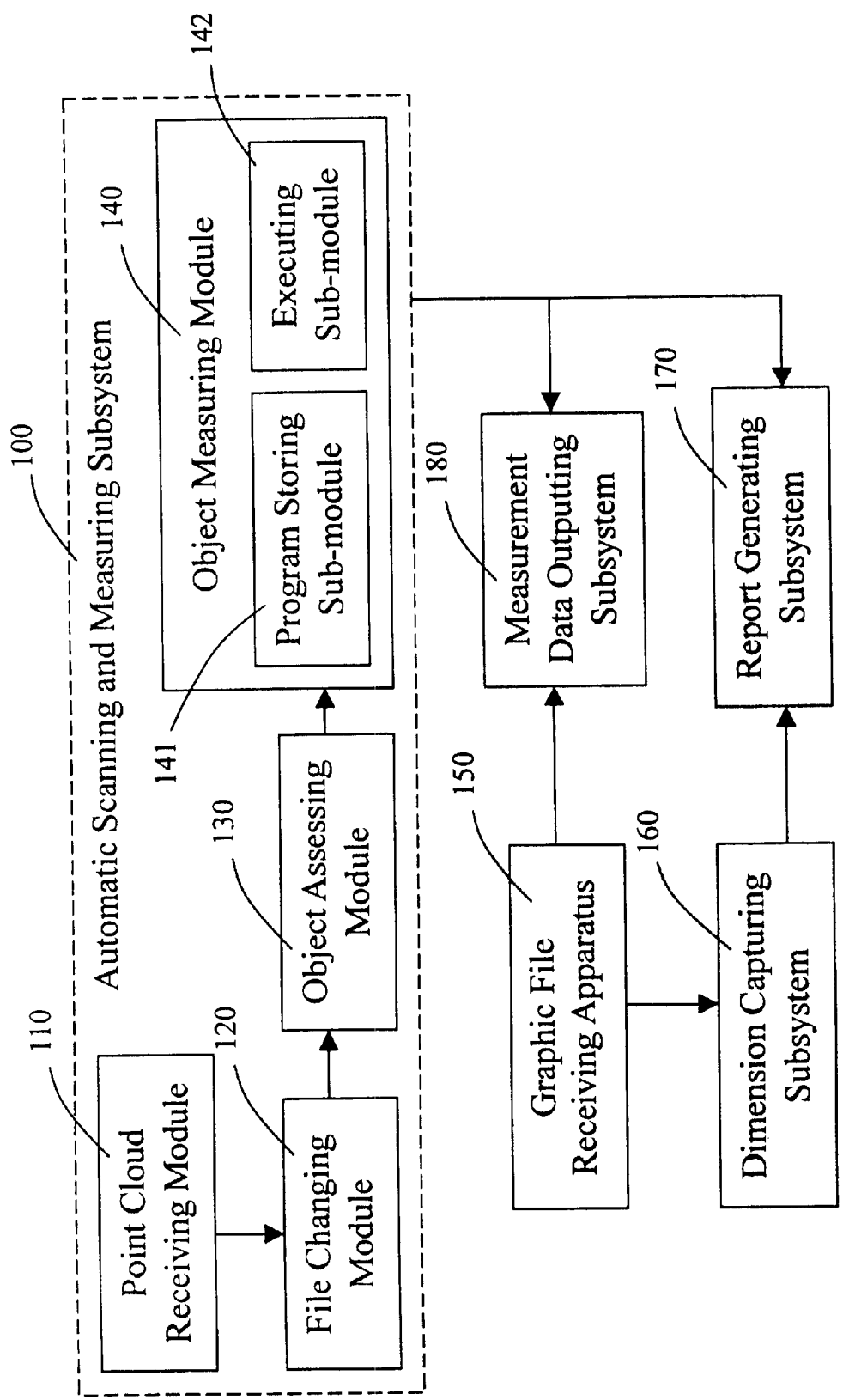
FIG. 1 is a schematic diagram of infrastructure of a system for analyzing and processing measurement data automatically, in accordance with a preferred embodiment of the present invention.

FIG. 1 is a schematic diagram of infrastructure of a system for analyzing and processing data on an object automatically, in accordance with a preferred embodiment of the present invention. The system for analyzing and processing data can support the method of the disclosed subject matter. The system for analyzing and processing measurement data comprises an automatic scanning and measuring subsystem 100, a graphic file receiving apparatus 150, a dimension capturing subsystem 160, a report generating subsystem 170, and a measurement data outputting subsystem 180.

The automatic scanning and measuring subsystem 100 comprises a point cloud receiving module 110, a file changing module 120, an object assessing module 130, and an object measuring module 140. The point cloud receiving module 110 is used for receiving point cloud data on an object from a scanner. The file changing module 120 is used for converting the point cloud data into files that can be identified and processed by a computer. For example, the file changing module 120 can change Initial Graphics Exchange Specification (IGES) format point cloud data into text format files that can be processed by the computer. The object assessing module 130 is used to ascertain whether there are programs available for measuring the object. The object measuring module 140 is used for obtaining measurement data on the object, if the object assessing module 130 determines there are programs available for measuring the object. The programs process the text format files to obtain the measurement data. The object measuring module 140 comprises a program storing sub-module 141, and an executing sub-module 142.

The graphic file receiving apparatus 150 is used for receiving graphic files of objects provided by users. In the preferred embodiment of the present invention, each graphic file is a computer aided design (CAD) drawing. The dimension capturing subsystem 160 is used for obtaining design dimensions of figure units in the graphic file received by the graphic file receiving apparatus 150. The report generating subsystem 170 can create different forms of reports according to requests made by users. Such reports include the measurement data obtained by the object measuring module 140, and the design dimensions obtained by the dimension capturing subsystem 160. The measurement data outputting subsystem 180 is used to output the measurement data obtained by the object measuring module 140 to the graphic file received by the graphic file receiving apparatus 150.

Figure 2:
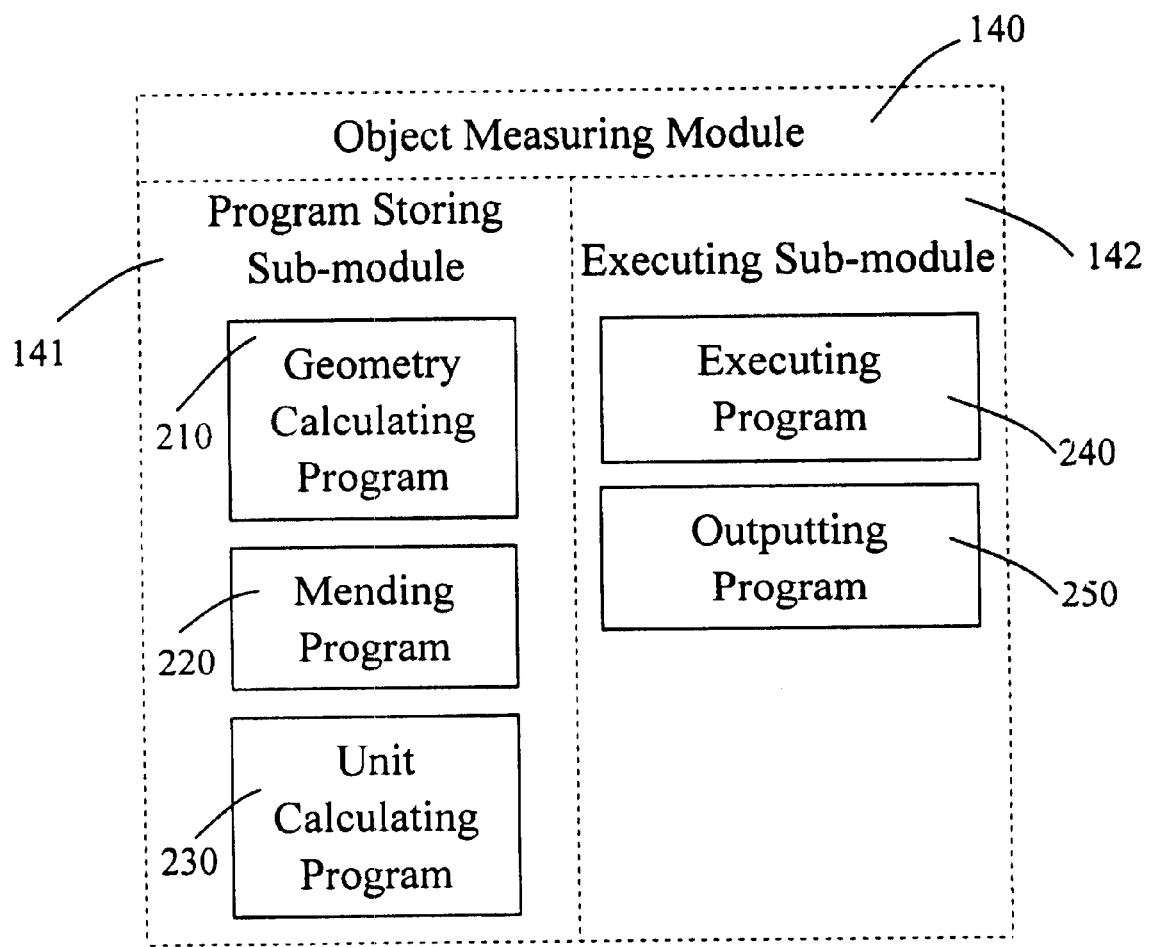
FIG. 2 is a schematic diagram of details of sub-modules of an object measuring module of the system of FIG. 1.

FIG. 2 is a schematic diagram of details of sub-modules of the object measuring module 140. The object measuring module 140 comprises a program storing sub-module 141, and an executing sub-module 142. The program storing sub-module 141 comprises a geometry calculating program 210, a mending program 220, and a unit calculating program 230. The executing sub-module 142 comprises an executing program 240, and an outputting program 250. The executing program 240 is used for invoking programs in the program storing sub-module 141, and executing the programs to generate measurement data on the object. The outputting program 250 is used for transmitting the generated measurement data to the report generating subsystem 170 and the measurement data outputting subsystem 180.

Figure 3:
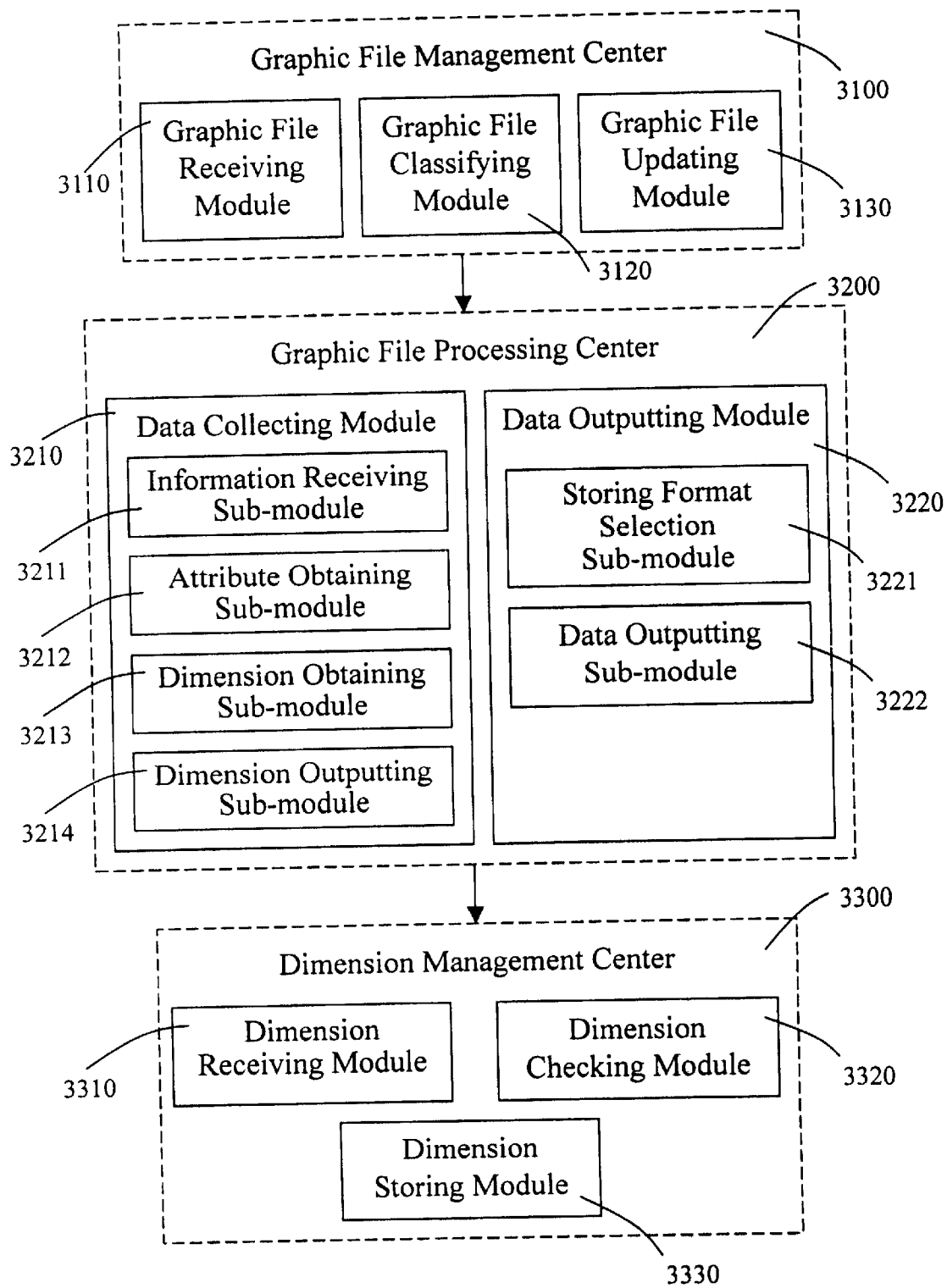
FIG. 3 is a schematic diagram of infrastructure of a dimension capturing subsystem of the system of FIG. 1.

FIG. 3 is a schematic diagram of infrastructure of the dimension capturing subsystem 160. The dimension capturing subsystem 160 comprises a graphic file management center 3100, a graphic file processing center 3200, and a dimension management center 3300. The graphic file management center 3100 includes a graphic file receiving module 3110, a graphic file classifying module 3120, and a graphic file updating module 3130. The graphic file receiving module 3110 is used for obtaining a graphic file from the graphic file receiving apparatus 150. The graphic file classifying module 3120 is used for classifying the obtained graphic file according to different companies or different drawing tools. The graphic file updating module 3130 is used for determining whether the obtained graphic file meets a user's demands, especially the user's version demand. The version is regulated according to points in time at which the obtained graphic file is drawn and modified.

The graphic file processing center 3200 is the core of the dimension capturing subsystem 160, and comprises a data collecting module 3210 and a data outputting module 3220. The data collecting module 3210 comprises an information receiving sub-module 3211, an attribute obtaining sub-module 3212, a dimension obtaining sub-module 3213, and a dimension outputting sub-module 3214.

The information receiving sub-module 3211 is used to receive information input by the user. The input information comprises a first piece of information input from a user interface, and a second piece of information input from the graphic file. The first piece of information comprises dimension tolerance, unit location, dimension unit, and storing path. The dimension tolerance can be assigned to any measurement data obtained by the dimension capturing subsystem 160. The dimension unit shows which system of measurement is employed: metric or imperial. The second piece of information comprises figure number, design dimension, unit calculating area, and scale.

The attribute obtaining sub-module 3212 is used to select from the graphic file those figure units whose attributes are in accordance with a pre-requested attribute, and to output the attributes of the selected figure units to an attribute sheet in a Microsoft Excel electronic book. In the preferred embodiment of the present invention, the pre-requested attribute is that any classification attribute is digital.

The dimension obtaining sub-module 3213 is used to determine design dimensions which are respectively closest to figure numbers in the graphic file, and to output the design dimensions and corresponding figure numbers to a design dimension sheet in the Excel book.

The dimension outputting sub-module 3214 is used to process the design dimensions obtained by the dimension obtaining sub-module 3213. The dimension outputting sub-module 3214 comprises an information collecting program, a format changing program, an information filtering program, and an information storing program. The information collecting program is used to combine the tolerances, figure numbers and design dimensions into one sheet in the Excel book. The format changing program is used to convert CAD format dimensions into text format dimensions. The information filtering program is used to delete information that is not needed, such as figure numbers and design dimensions in a buffer.

The data outputting module 3220 is used to output the dimensions obtained by the dimension obtaining sub-module 3213 to the dimension management center 3300. The data outputting module 3220 comprises a storing format selection sub-module 3221, and a data outputting sub-module 3222. The storing format selection sub-module 3221 is used to determine a particular format in which the obtained dimensions are to be stored. Predetermined formats are stored in a format database (not shown). The data outputting sub-module 3222 is used to output measurements generated by the dimension outputting sub-module 3214 to the dimension management center 3300.

The dimension management center 3300 comprises a dimension receiving module 3310, a dimension checking module 3320, and a dimension storing module 3330. The dimension receiving module 3310 is used to receive the design dimensions from the graphic file processing center 3200. The dimension checking module 3320 is used to check whether the design dimensions are valid. The dimension storing module 3330 is used to store the design dimensions in the format determined by the storing format selection sub-module 3221.

Figure 4:
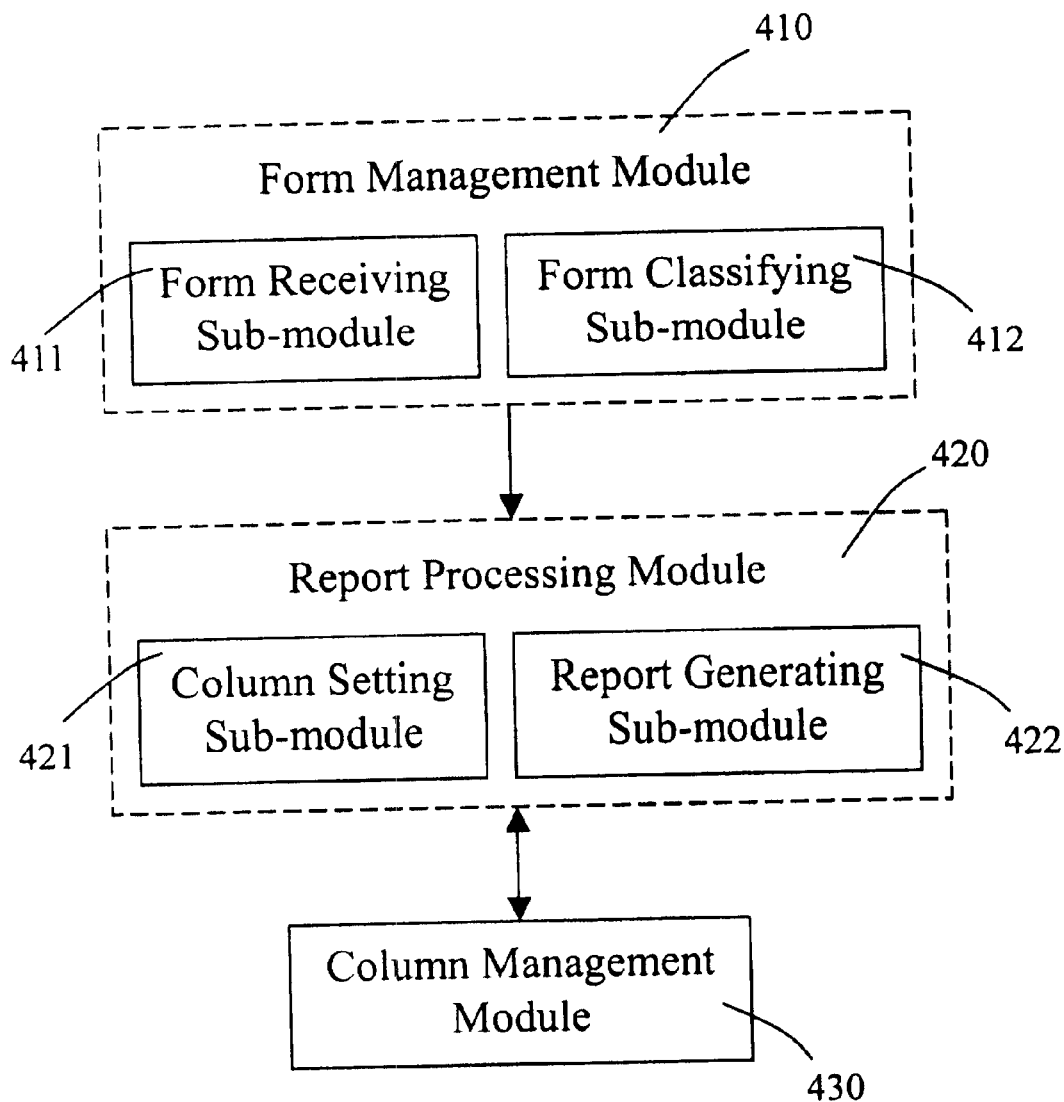
FIG. 4 is a schematic diagram of details of modules of a report generating subsystem of the system of FIG. 1.

FIG. 4 is a schematic diagram of details of modules of the report generating subsystem 170. The report generating subsystem 170 comprises a form management module 410, a report processing module 420, and a column management module 430. The form management module 410 comprises a form receiving sub-module 411, and a form classifying sub-module 412. The form receiving sub-module 411 is used for receiving report templates provided by users, and for receiving data used for generating reports. Such data comprise the measurement data generated by the automatic scanning and measuring subsystem 100, and the design dimensions obtained by the dimension capturing subsystem 160. The form classifying sub-module 412 is used for classifying the report templates. For example, the report templates may be classified according to different companies.

The report processing module 420 comprises a column setting sub-module 421, and a report generating sub-module 422. The column setting sub-module 421 is used to set columns for a report to be generated. The columns comprise figure number, design dimension, tolerance, and measurement. The report generating sub-module 422 is used to generate a report according to the template of the report.

The column management module 430 is used for storing columns set by the column setting sub-module 421. When generating a report, the report generating sub-module 422 can invoke columns in the column management module 430.

Figure 5:
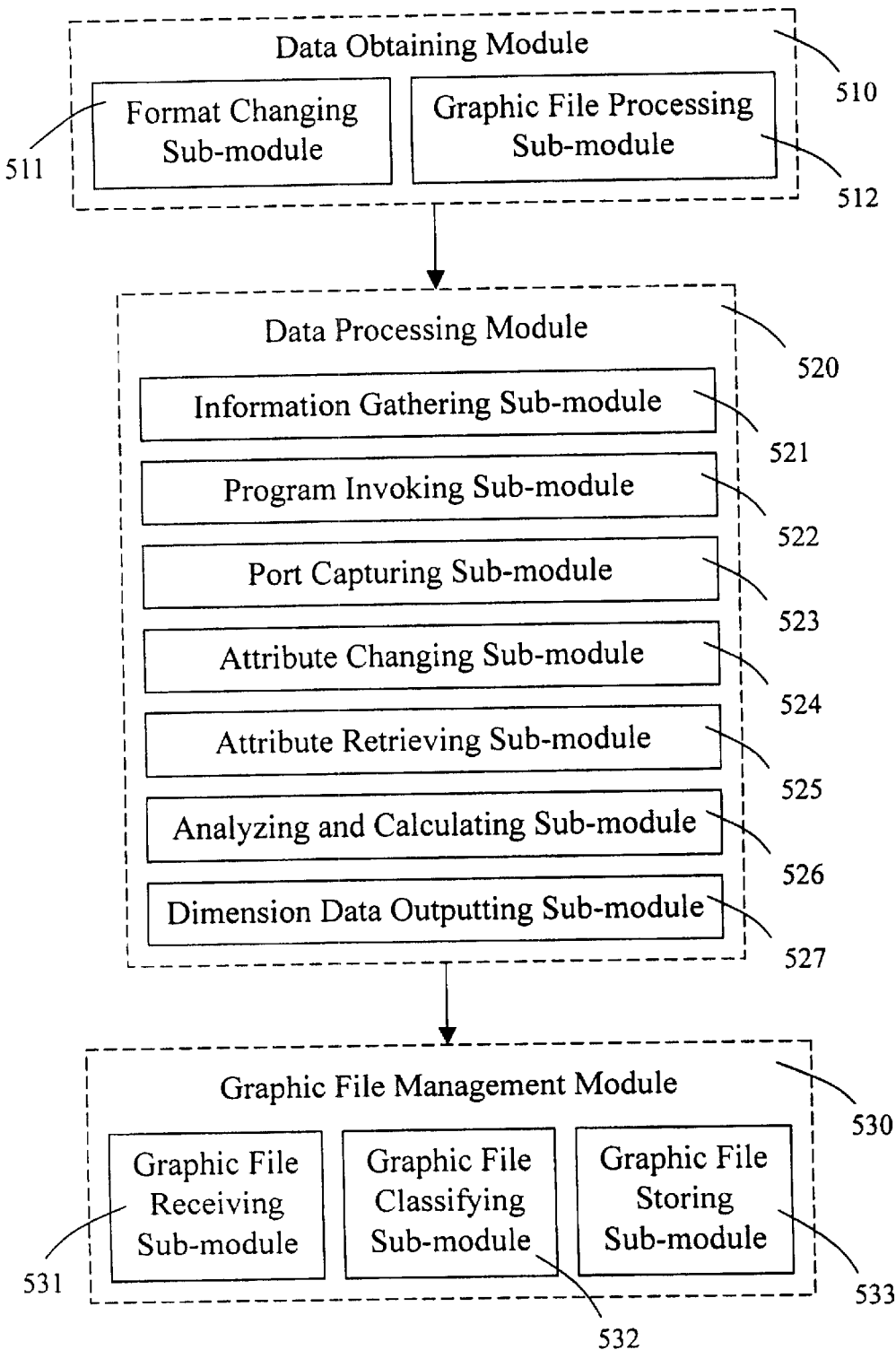
FIG. 5 is a schematic diagram of details of modules of a measurement data outputting subsystem of the system of FIG. 1.

FIG. 5 is a schematic diagram of details of modules of the measurement data outputting subsystem 180. The measurement data outputting subsystem 180 comprises a data obtaining module 510, a data processing module 520, and a graphic file management module 530. The data obtaining module 510 comprises a format changing sub-module 511, and a graphic file processing sub-module 512. The format changing sub-module 511 is used for outputting the measurement data generated by the automatic scanning and measuring subsystem 100 to the Excel book. The graphic file processing sub-module 512 is used for opening a graphic file to have measurement data input therein.

The data processing module 520 is used to output the measurement data to the graphic file. The data processing module 520 comprises an information gathering sub-module 521, a program invoking sub-module 522, a port capturing sub-module 523, an attribute changing sub-module 524, an attribute retrieving sub-module 525, an analyzing and calculating sub-module 526, and a dimension data outputting sub-module 527. The information gathering sub-module 521 is used for collecting data input by a user, which data can assist outputting of the measurement data to the graphic file.

The input data include figure number column, design dimension column, tolerance column, manner in which the measurement data is output, color and font of measurement data, and color of any measurement that exceeds a design tolerance of a corresponding figure unit. The program invoking sub-module 522 is used for invoking various process programs. Such process programs are invoked according to the input data collected by the information gathering sub-module 521 regarding the manner in which the measurement data is output. The port capturing sub-module 523 is used for obtaining a port connecting the measurement data and the graphic file. The attribute changing sub-module 524 is used for changing any non-text format measurement data into text format measurement data. The attribute retrieving sub-module 525 is used to retrieve attributes of figure units in the graphic file. The analyzing and calculating sub-module 526 is used to connect the measurement data in the Excel book with the retrieved attributes, and thereby determine which measurement data should be output. The dimension data outputting sub-module 527 is used for outputting the determined measurement data to the graphic file.

The graphic file management module 530 comprises a graphic file receiving sub-module 531, a graphic file classifying sub-module 532, and a graphic file storing sub-module 533. The graphic file receiving sub-module 531 is used for receiving graphic files that have had measurement data input therein. The graphic file classifying sub-module 532 is used to classify the graphic files that have had measurement data input therein. For example, such classification may be according to different companies. The graphic file storing sub-module 533 is used to store the graphic files that have had measurement data input therein.

Figure 6:
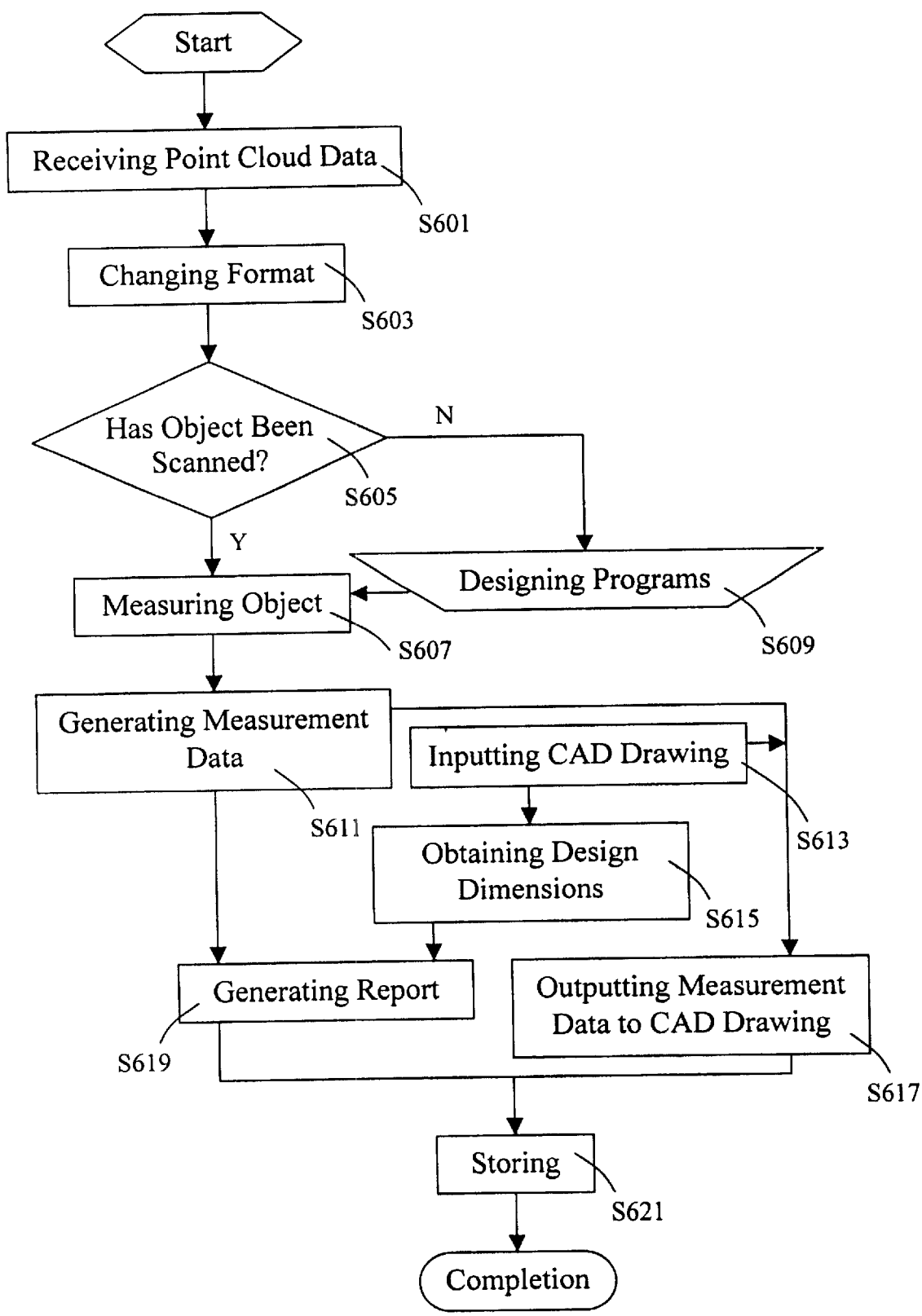
FIG. 6 is a flow chart of analyzing and processing data on an object in accordance with a preferred embodiment of the present invention.

FIG. 6 is a flow chart of analyzing and processing measurement data on an object in accordance with a preferred embodiment of the present invention. Firstly, in step S601, the point cloud receiving module 110 receives point cloud data on the object. In step S603, the file changing module 120 changes the point cloud data into formats that can be processed by the computer. Generally, the point cloud data are in Initial Graphics Exchange Specification (IGES) format. In the preferred embodiment of the present invention, the file changing module 120 changes the IGES format point cloud data into text format data. In step S605, the object assessing module 130 ascertains whether the object has been scanned, according to the text format data. If the object has been scanned, then the object assessing module 130 shows whether there are measuring programs available for measuring the object in the program storing sub-module 141. If there are measuring programs available, then in step S607 the executing program 240 invokes the measuring programs to measure the object. In step S611, the executing program 240 generates measurement data on the object. If the object has not been scanned, then in step S609 the object assessing module 130 advises the user to design measuring programs for the object. After the measuring programs are designed and written, in step S607 the executing program 240 invokes them to measure the object.

The measurement data generated at step S611 are stored in a format which can be identified by the computer. In the preferred embodiment of the present invention, the measurement data are stored in a measurement sheet in the Excel book. The stored measurement data can be used by the report generating subsystem 170 for generating a dimension report on the object. The stored measurement data can also be used by the measurement data outputting subsystem 180 for outputting to a graphic file of the object.

In step S613, the graphic file receiving apparatus 150 receives a graphic file of the object. In the preferred embodiment of the present invention, the graphic file of the object is a CAD drawing. The graphic file is transmitted to the graphic file management center 3100 and to the data obtaining module 510. The graphic file can be processed by the dimension capturing subsystem 160. Thus, in step S615, design dimensions of the object are obtained. Also, in step S617, measurement data on the object are output to the graphic file by the measurement data outputting subsystem 180. In step S619, a dimension report on the object is generated via combining the design dimensions of the object obtained at step S615 and the measurement data on the object obtained at step S611. Finally, in step S621, the dimension report and the graphic file that has had measurement data input therein are stored.

Figure 7:
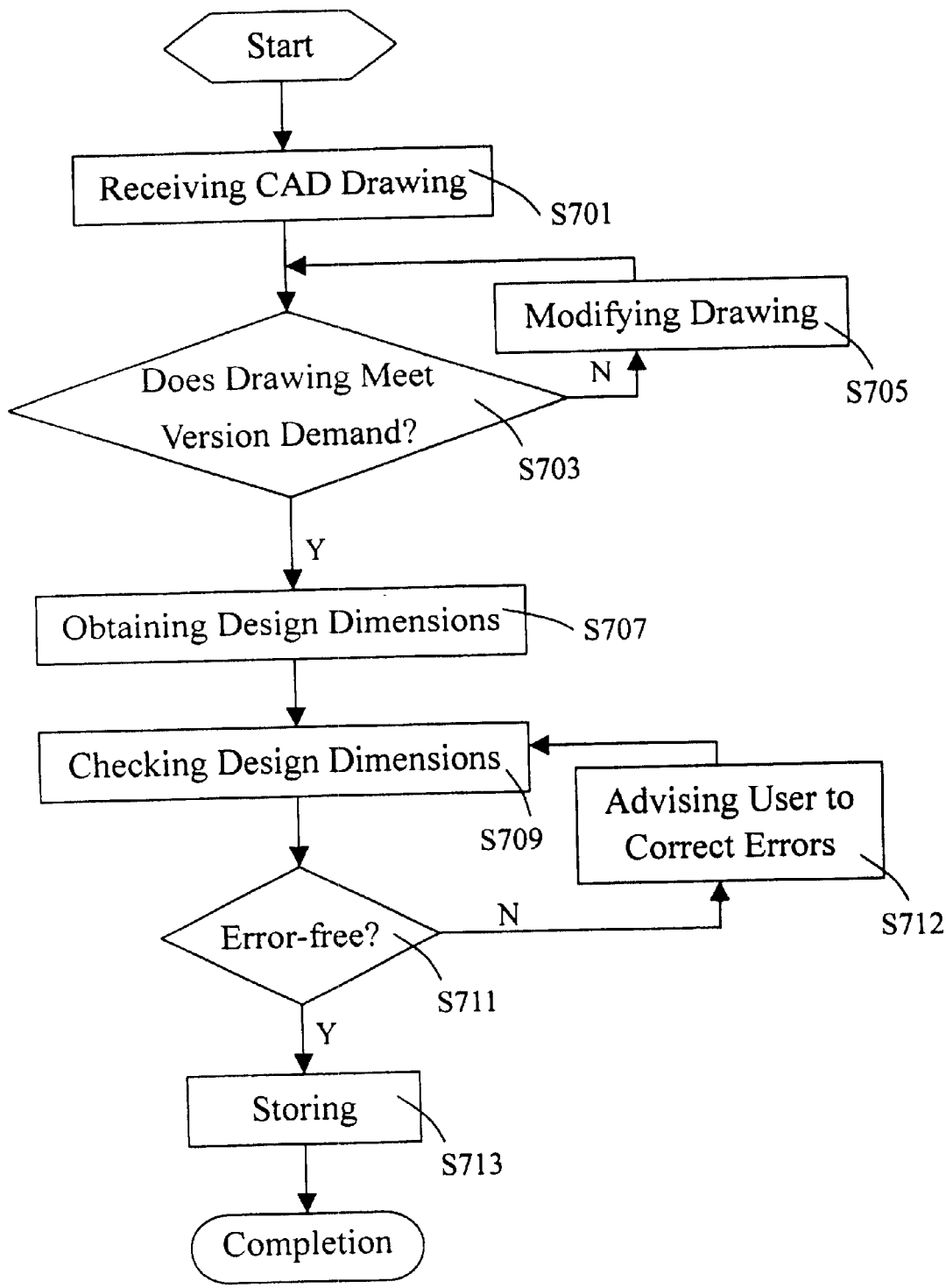
FIG. 7 is a flow chart of obtaining dimensions of an object in accordance with the preferred embodiment of the present invention.

FIG. 7 is a flow chart of obtaining design dimensions of an object in accordance with the preferred embodiment of the present invention. Firstly, in step S701, the graphic file receiving module 3110 receives a CAD drawing of the object from the graphic file receiving apparatus 150. In step S703, the graphic updating module 3130 determines whether the CAD drawing of the object meets the user's version demand. If the CAD drawing does not meet the user's version demand, then in step S705 the graphic file updating module 3130 advises the user to modify the CAD drawing. If the CAD drawing meets the user's version demand, then in step S707 the graphic file processing center 3200 processes the CAD drawing to obtain the design dimensions of the object.

The design dimensions of the object are received by the dimension receiving module 3310. In step S709, the design dimensions are checked by the dimension checking module 3320. In step S711, the dimension checking module 3320 determines whether the design dimensions are error-free. If the design dimensions have any errors, then in step S712 the dimension checking module 3320 advises the user to correct the error(s). If the design dimensions are error-free, then in step S713 the design dimensions are stored by the dimension storing module 3330.

Figure 8:
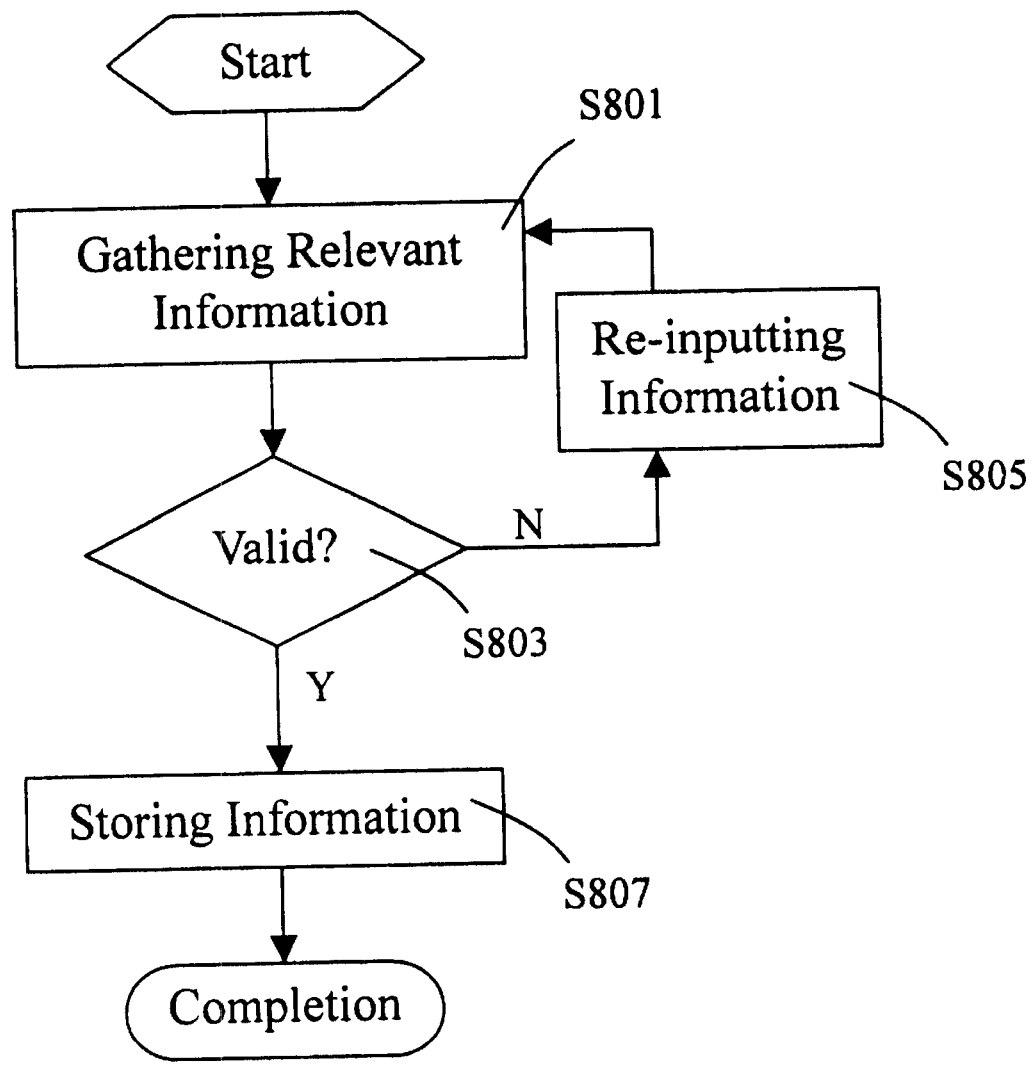
FIG. 8 is a flow chart of gathering information when a graphic file processing center obtains design dimensions from a computer aided design (CAD) drawing, in accordance with the preferred embodiment of the present invention.

FIG. 8 is a flow chart of gathering information when the graphic file processing center 3200 obtains design dimensions from a CAD drawing, in accordance with the preferred embodiment of the present invention. In step S801, relevant information is gathered. This is performed mainly by the information receiving sub-module 3211. The information gathered includes the first piece of information comprising dimension tolerance, unit location, dimension unit and storing path; and the second piece of information comprising figure number, design dimension, unit calculating area and scale. In step S803, the information receiving sub-module 3211 determines whether all the gathered information is valid. If any of the gathered information is invalid, then in step S805 the information receiving sub-module 3211 advises the user to re-input the information. If all the gathered information is valid, then in step S807 the information receiving sub-module 3211 stores the gathered information.

Figure 9:
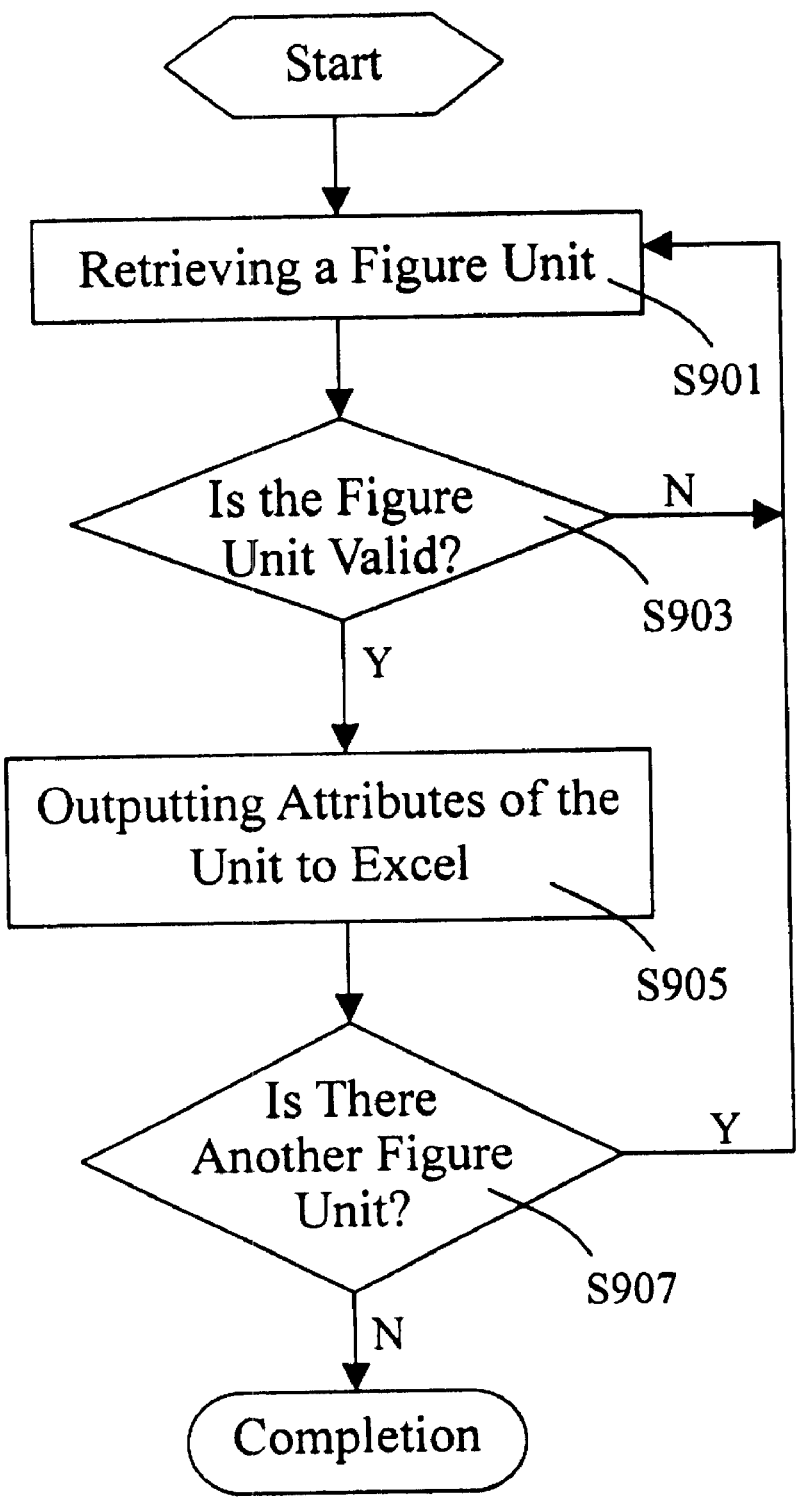
FIG. 9 is a flow chart of retrieving attributes of figure units in the CAD drawing when the graphic file processing center obtains design dimensions from the CAD drawing, in accordance with the preferred embodiment of the present invention.

FIG. 9 is a flow chart of retrieving attributes of figure units in a CAD drawing when the graphic file processing center 3200 obtains design dimensions from the CAD drawing, in accordance with the preferred embodiment of the present invention. In step S901, the attribute obtaining sub-module 3212 retrieves a figure unit in a unit calculating area input by the user. In step S903, the attribute obtaining sub-module 3212 determines whether the attributes of the figure unit are valid insofar as they are in accordance with a pre-requested attribute. In the preferred embodiment of the present invention, the pre-requested attribute is that any classification attribute is digital. Figure units whose classification attributes are digital are figure numbers and design dimensions. If the classification attributes of the figure unit are not digital, then the attribute obtaining sub-module 3212 goes back to step S901 to retrieve another figure unit in the unit calculating area. If the classification attributes of the figure unit are digital, then in step S905 the attribute obtaining sub-module 3212 outputs relevant attributes of the figure unit to the attribute sheet of the Excel book. The relevant attributes comprise X-axis and Y-axis coordinate values of the figure unit. In step S907, the attribute obtaining sub-module 3212 checks whether there is another figure unit in the unit calculating area. If there is another figure unit, then the attribute obtaining sub-module 3212 continues to retrieve attributes of that figure unit according to step S901 and the foregoing applicable steps. If and when there is no other figure unit, the procedure is completed.

Figure 10:
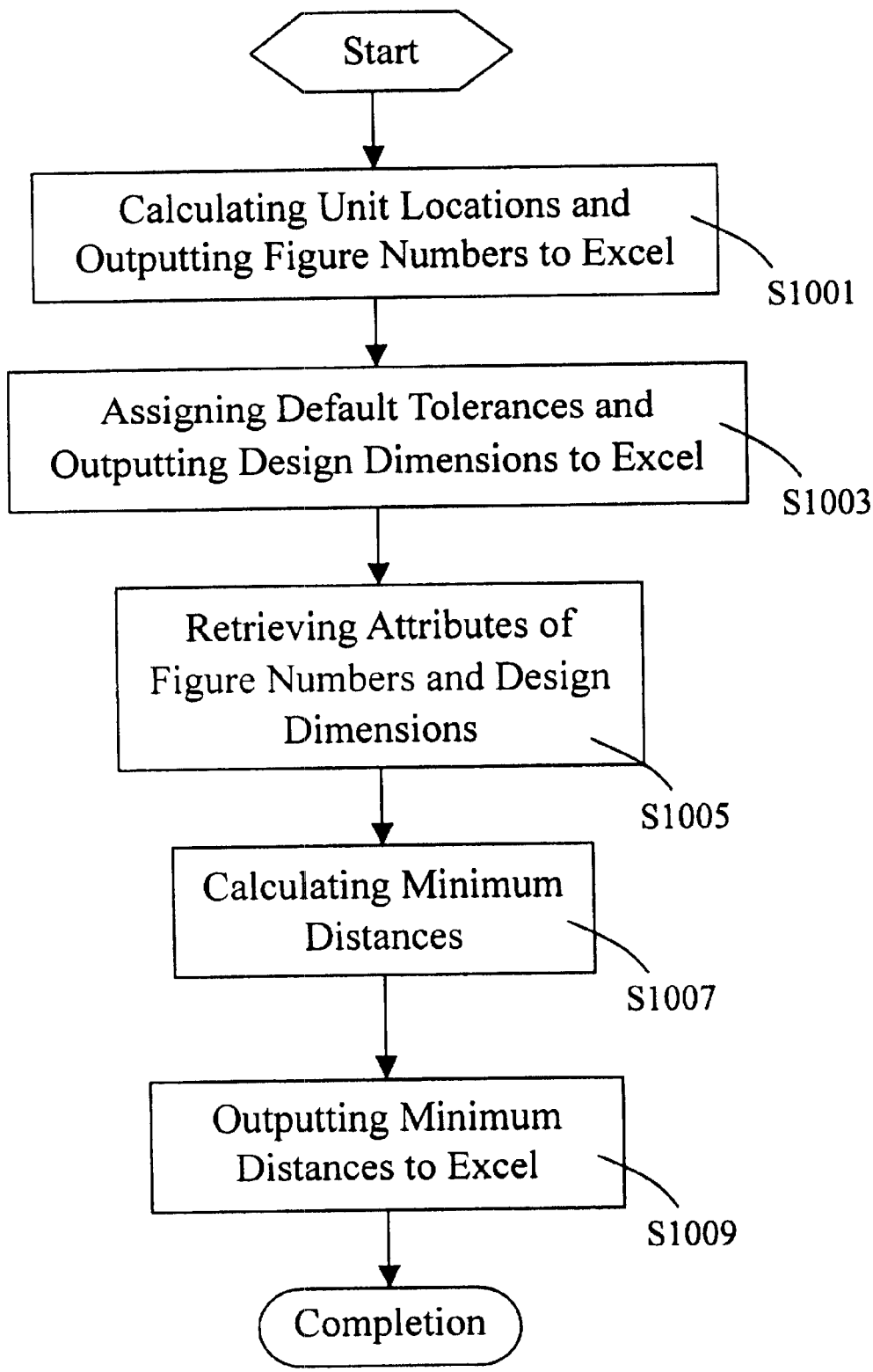
FIG. 10 is a flow chart of determining a relationship of figure numbers and design dimensions when the graphic file processing center obtains design dimensions from the CAD drawing, in accordance with the preferred embodiment of the present invention.

FIG. 10 is a flow chart of determining a relationship of figure numbers and design dimensions when the graphic file processing center 3200 obtains design dimensions from a CAD drawing, in accordance with the preferred embodiment of the present invention. In step S1001, the dimension obtaining sub-module 3213 calculates unit locations of figure units in a unit calculating area, to determine whether the figure numbers are in a predetermined figure area. The dimension obtaining sub-module 3213 outputs any figure numbers that are in the predetermined figure area to a figure number sheet in the Excel book. In step S1003, the dimension obtaining sub-module 3213 checks whether all design dimensions have tolerances, assigns a default tolerance to those design dimensions having no tolerance, and outputs the design dimensions to a tolerance sheet in the Excel book. The default tolerance is input by the user beforehand, and is obtained by the information receiving sub-module 3211. In step S1005, the dimension obtaining sub-module 3213 retrieves the attributes of figure numbers and design dimensions. The attributes comprise X-axis and Y-axis coordinate values of the figure numbers, and X-axis and Y-axis coordinate values of the design dimensions. In step S1007, the dimension obtaining sub-module 3213 calculates the minimum distances between each figure number and any design dimension. In step S1009, the dimension obtaining sub-module 3213 outputs each minimum distance and related figure number and design dimension to a minimum distance sheet in the Excel book.

Figure 11:
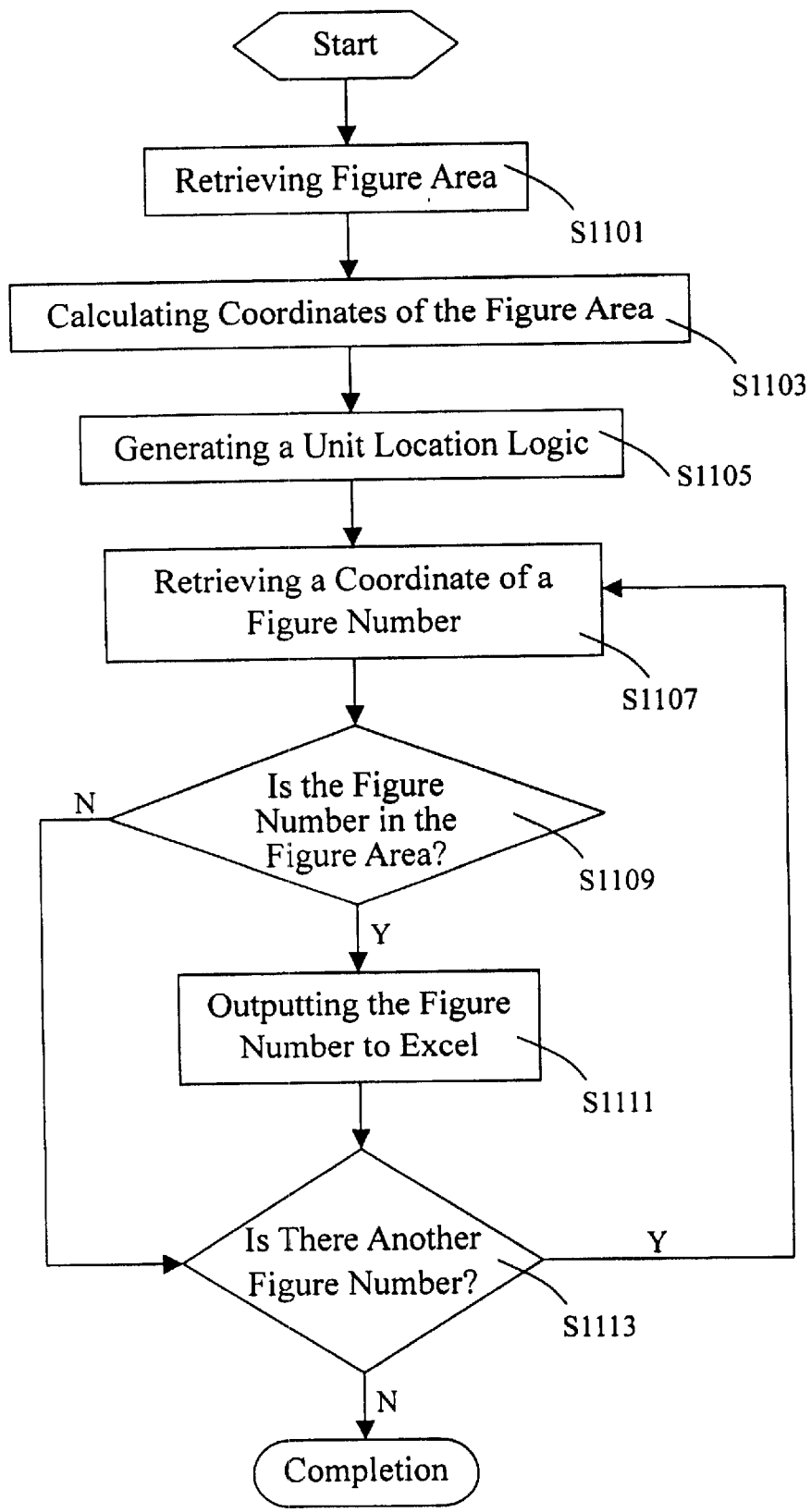
FIG. 11 is a flow chart of details of one of the steps of FIG. 10, namely calculating unit locations and outputting figure numbers.

FIG. 11 is a flow chart of details of step S1001 of FIG. 10, namely calculating unit locations and outputting figure numbers. In step S1101, the dimension obtaining sub-module 3213 retrieves the predetermined figure area input by the user. In step S1103, the dimension obtaining sub-module 3213 calculates a coordinate range of the figure area. In step S1105, the dimension obtaining sub-module 3213 generates a unit location logic for determining whether a figure number lies in the figure area. In step S1107, the dimension obtaining sub-module 3213 retrieves a coordinate of a figure number from the attribute sheet in the Excel book. In step S1109, the dimension obtaining sub-module 3213 uses the unit location logic to determine whether the figure number lies in the figure area. If the figure number does not lie in the figure area, then the dimension obtaining sub-module 3213 proceeds directly to step S1113 described below. If the figure number lies in the figure area, then in step S1111 the dimension obtaining sub-module 3213 outputs the figure number to the figure number sheet in the Excel book, and then proceeds to step S1113. In step 1113, the dimension obtaining sub-module 3213 ascertains whether there is another figure number in the attribute sheet of the Excel book. If there is another figure number, then in step 1107 again, the dimension obtaining sub-module 3213 retrieves a coordinate of the other figure number from the attribute sheet in the Excel book, and proceeds according to the applicable above-described procedure. If and when there is no other figure number, the procedure is completed.

Figure 12:
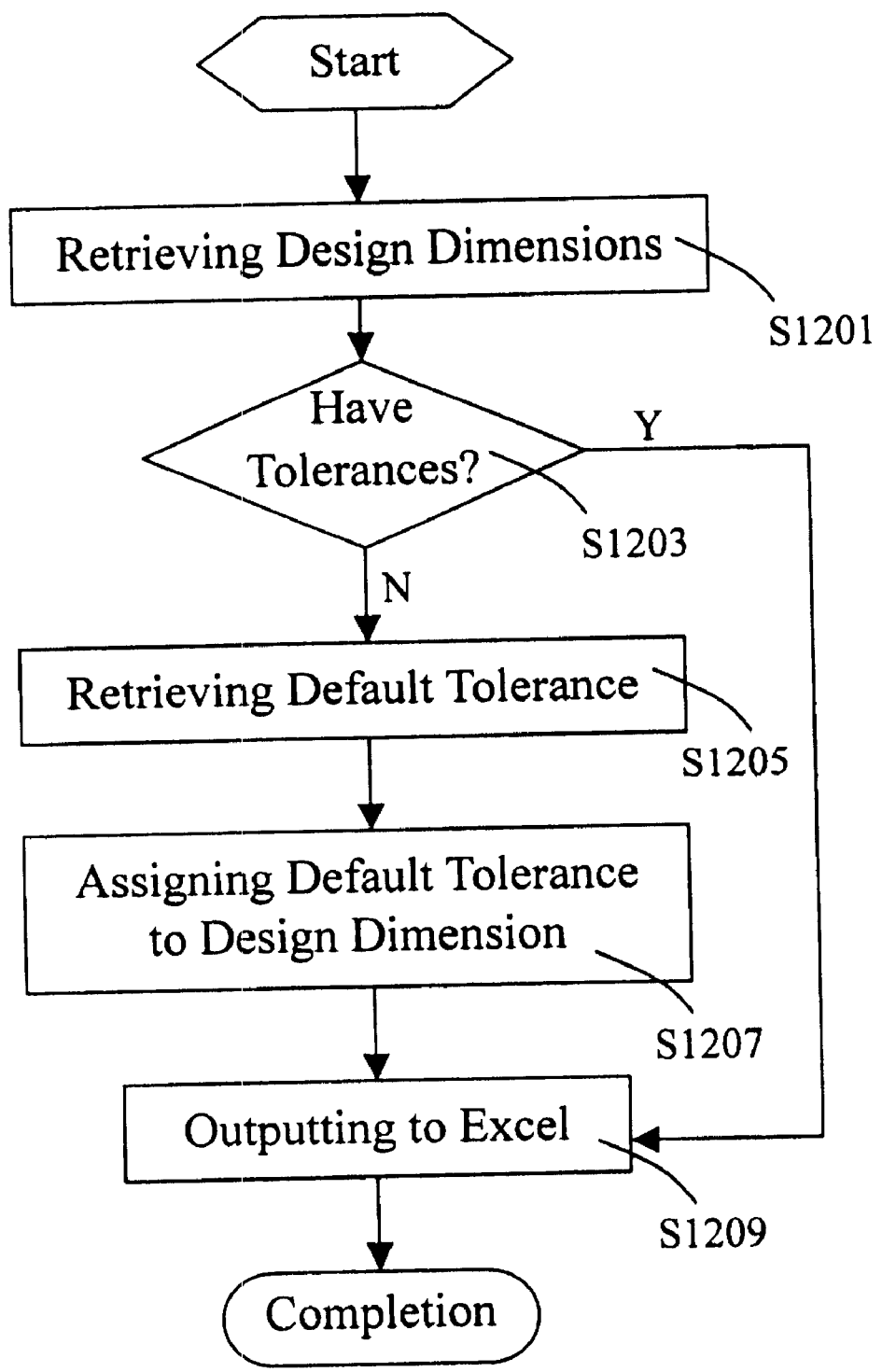
FIG. 12 is a flow chart of details of another of the steps of FIG. 10, namely assigning default tolerances and outputting design dimensions.

FIG. 12 is a flow chart of details of step S1003 of FIG. 10, namely assigning default tolerances and outputting design dimensions. Firstly, in step S1201, the dimension obtaining sub-module 3213 retrieves design dimensions of figure units from the attribute sheet of the Excel book. In step S1203, the dimension obtaining sub-module 3213 ascertains whether all the design dimensions have tolerances. If a design dimension has a tolerance, then in step S1209 the dimension obtaining sub-module 3213 outputs the design dimension and accompanying tolerance to the tolerance sheet in the Excel book. If a design dimension does not have a tolerance, then in step S1205 the dimension obtaining sub-module 3213 retrieves the default tolerance. In step S1207, the dimension obtaining sub-module 3213 assigns the default tolerance to the design dimension. Finally, in step S1209, all design dimensions are output to the tolerance sheet in the Excel book with their respective accompanying tolerances.

Figure 13:
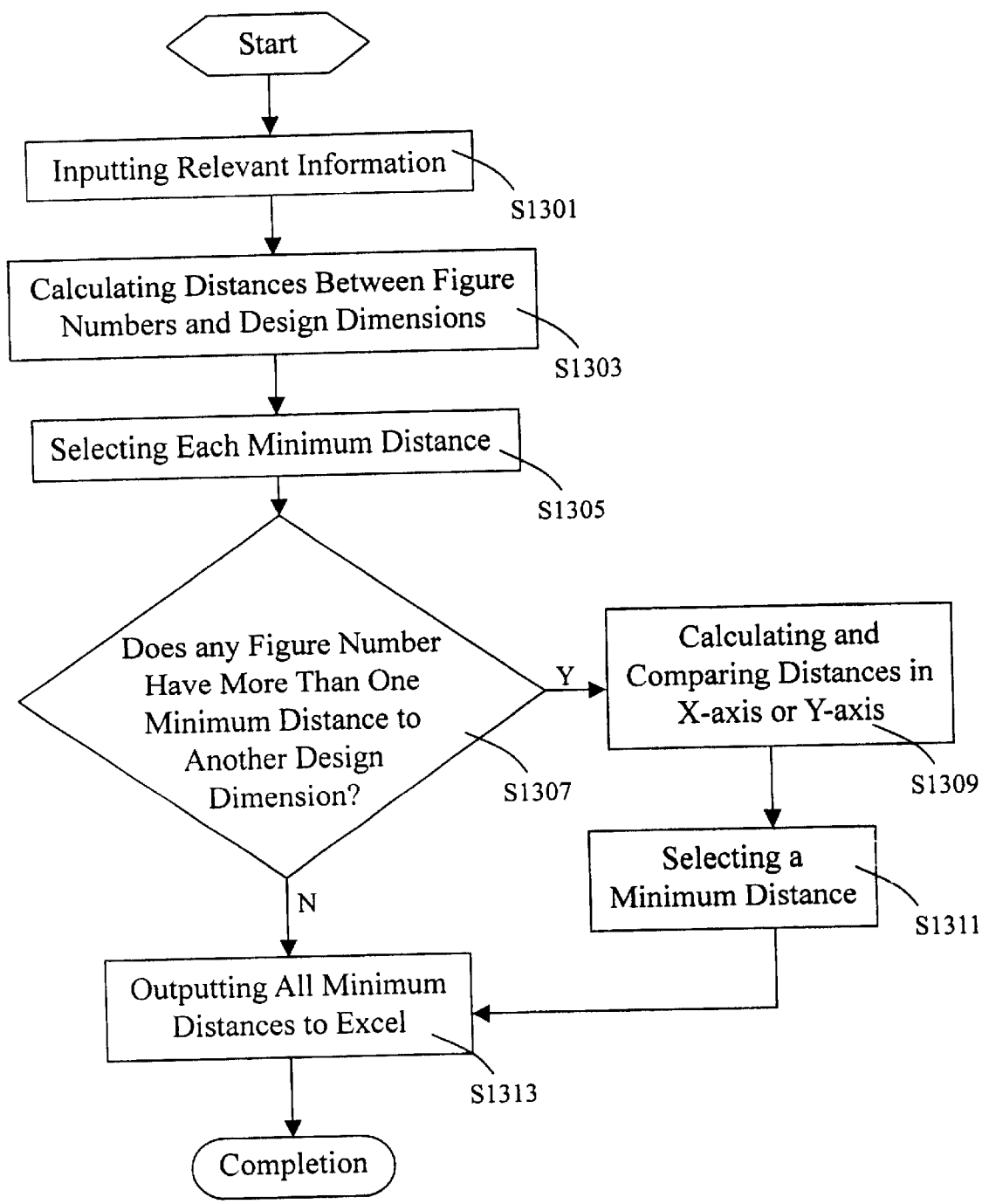
FIG. 13 is a flow chart of details of still another of the steps of FIG. 10, namely calculating minimum distances between each figure number and any design dimension.

FIG. 13 is a flow chart of details of step S1007 of FIG. 10, namely calculating minimum distances between each figure number and any design dimension. In step S1301, the dimension obtaining sub-module 3213 distributes figure units representing figure numbers, X-axis ordinate values thereof, and Y-axis ordinate values thereof to three buffers respectively. The dimension obtaining sub-module 3213 also distributes figure units representing design dimensions, X-axis ordinate values thereof, and Y-axis ordinate values thereof to three buffers respectively. In step S1303, the dimension obtaining sub-module 3213 calculates distances between each figure unit representing a figure number and other figure units representing design dimensions according to the formula 'SQR$((a-b)^2+(d-c)^2)$.' In this formula, 'a' represents the X-axis ordinate value of a figure unit representing the figure number, 'b' represents the X-axis ordinate value of a figure unit representing a design dimension, 'c' represents the Y-axis ordinate value of a figure unit representing a design dimension, and 'd' represents a Y-axis ordinate value of a figure unit representing a figure number. In step S1305, the dimension obtaining sub-module 3213 selects the minimum distances between each figure unit representing a figure number and other figure units representing design dimensions. In step S1307, the dimension obtaining sub-module 3213 checks whether there is more than one minimum distance between any figure unit representing a figure number and other figure units representing design dimensions. If there is more than one minimum distance between any figure unit representing a figure number and other figure units representing design dimensions, then in step S1309 the dimension obtaining sub-module 3213 compares distances between the figure unit representing the figure number and other figure units representing design dimensions in the X-axis direction or in the Y-axis direction. In step S1311, the dimension obtaining sub-module 3213 selects a minimum distance from the compared distances. After all minimum distances between figure units representing a figure number and other figure units representing design dimensions are compared and selected, in step S1313 the dimension obtaining sub-module 3213 outputs all the minimum distances to the minimum distance sheet in the Excel book.

Figure 14:
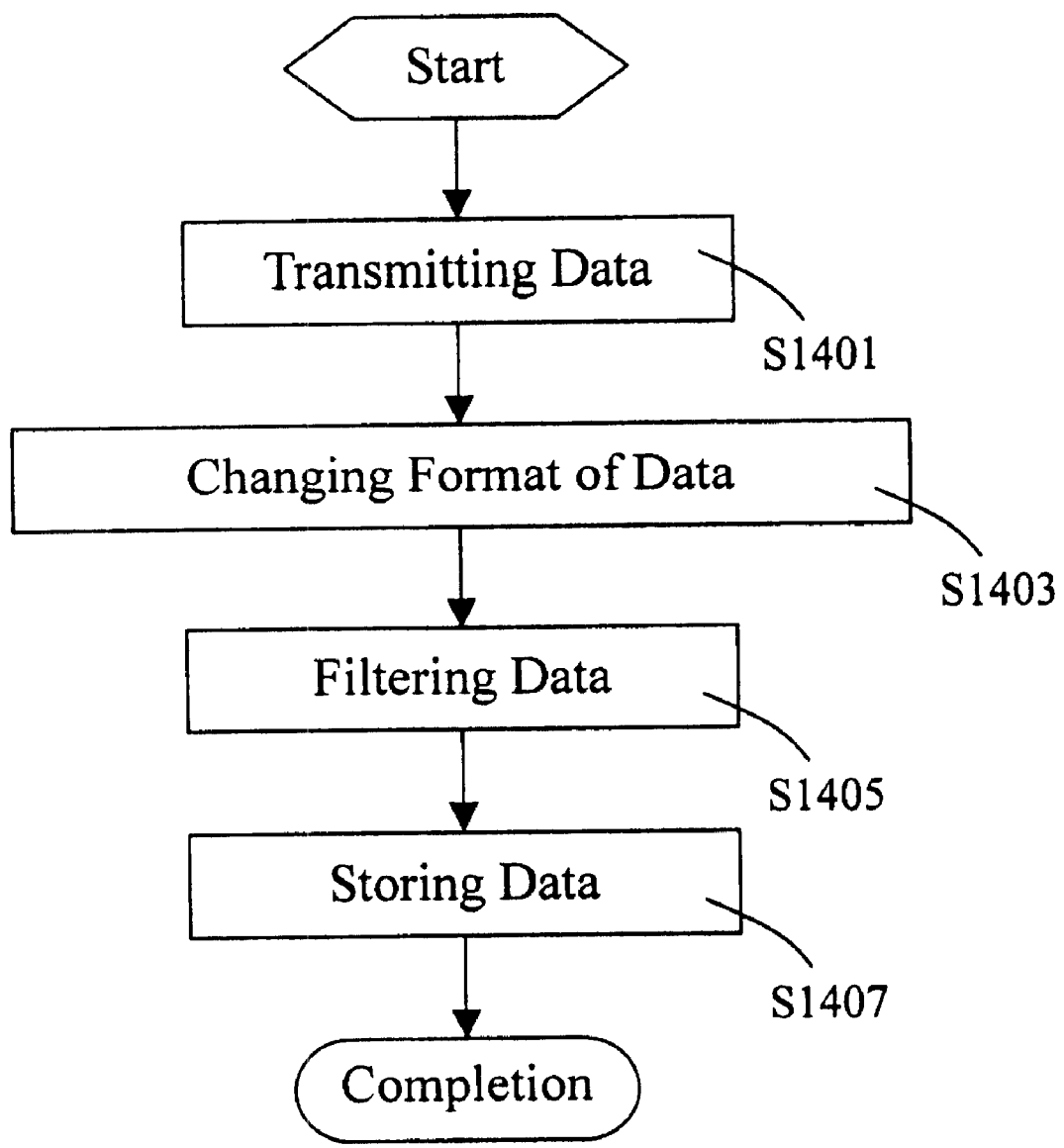
FIG. 14 is a flow chart of outputting data when the graphic file processing center obtains design dimensions from the CAD drawing, in accordance with the preferred embodiment of the present invention.

FIG. 14 is a flow chart of outputting data when the graphic file processing center 3200 obtains design dimensions from a CAD drawing, in accordance with the preferred embodiment of the present invention. In step S1401, the dimension obtaining sub-module 3213 transmits data in different sheets to the design dimension sheet in the Excel book. Such different sheets include figure number sheets, and tolerance sheets. In step S1403, the dimension obtaining sub-module 3213 changes data from CAD format into Excel format. In step S1405, the dimension obtaining sub-module 3213 filters the data by deleting data that are not needed. For example, data in memory are deleted. In step S1407, the dimension obtaining sub-module 3213 assigns a storing path of the Excel book comprising the design dimension sheet.

Figure 15:
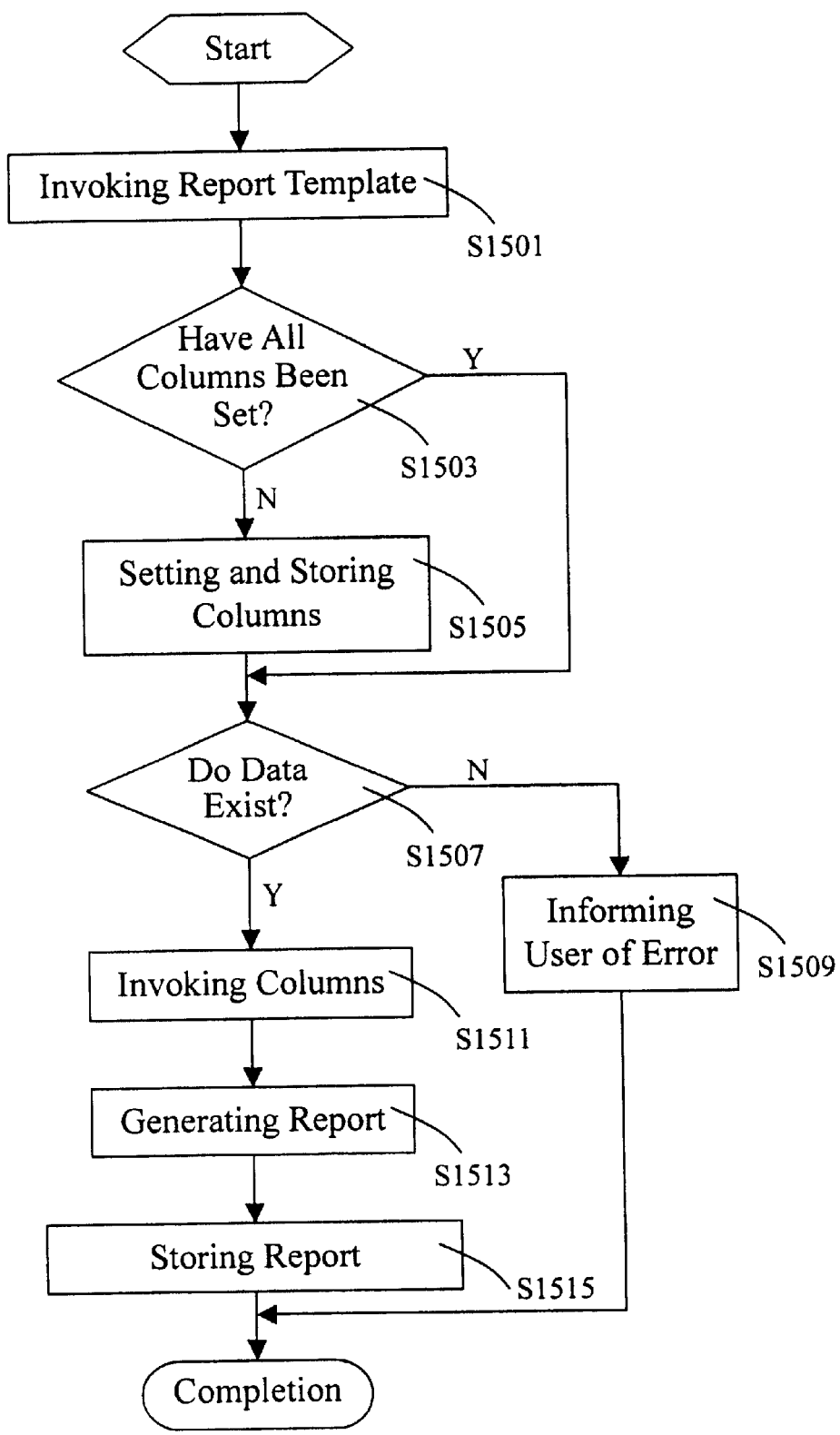
FIG. 15 is a flow chart of generating a report on an object, in accordance with the preferred embodiment of the present invention.

FIG. 15 is a flow chart of generating a report on an object in accordance with the preferred embodiment of the present invention. Firstly, in step S1501, the report generating sub-module 422 invokes a report template provided by a user beforehand. The report template may, for example, correspond to a company which produces the object. In step S1503, the report generating sub-module 422 ascertains whether all columns of the report template have been set. If all the columns have not been set, then in step S1505 the column setting sub-module 421 sets unset columns, and stores all such set columns in the column management module 430. If and when all the columns have been set, in step S1507 the report generating sub-module 422 checks whether measurement data on the object and design dimensions of the object exist. If either or both of the measurement data and the design dimensions do not exist, then in step S1509 the report generating subsystem 170 informs the user accordingly. If both the measurement data and the design dimensions exist, then in step S1511 the report generating sub-module 422 invokes columns of the report in the column management module 430. Such columns include the measurement data column, design dimension column, and tolerance column. In step S1513, the report generating sub-module 422 fills in the columns with the measurement data and the design dimensions, thereby generating a report according to the report template. Finally, in step S1515 the generated report is stored.

Figure 16:
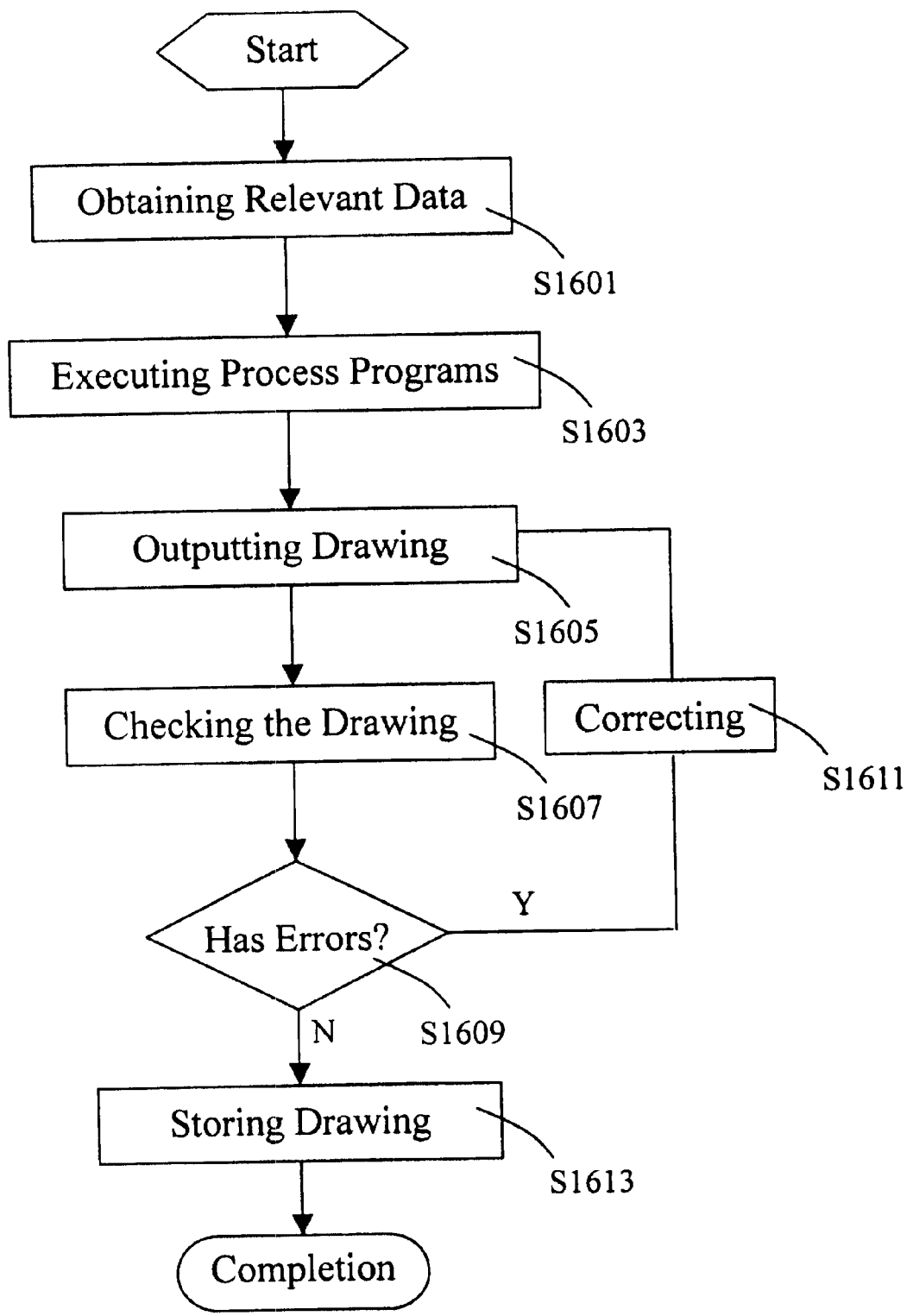
FIG. 16 is a flow chart of outputting measurement data on an object to a graphic file of the object, in accordance with the preferred embodiment of the present invention.

FIG. 16 is a flow chart of outputting measurement data on an object to a graphic file of the object, in accordance with the preferred embodiment of the present invention. Firstly, in step S1601, the data obtaining module 510 obtains relevant data. The relevant data includes a preliminary CAD drawing, and measurement data to be output to the preliminary CAD drawing. In step S1603, the data processing module 520 executes one or more process programs for outputting the measurement data to the preliminary CAD drawing. In step S1605, the data processing module 520 outputs the CAD drawing to the graphic file management module 530. In step S1607, the graphic file management module 530 checks the CAD drawing. In step S1609, the graphic file management module 530 determines whether the CAD drawing has errors. If the CAD drawing has errors, then in step S1611 the graphic file management module 530 advises the user to correct the errors. If and when the CAD drawing has no errors, in step S1613 the CAD drawing is stored in the graphic file storing sub-module 533.

Figure 17:
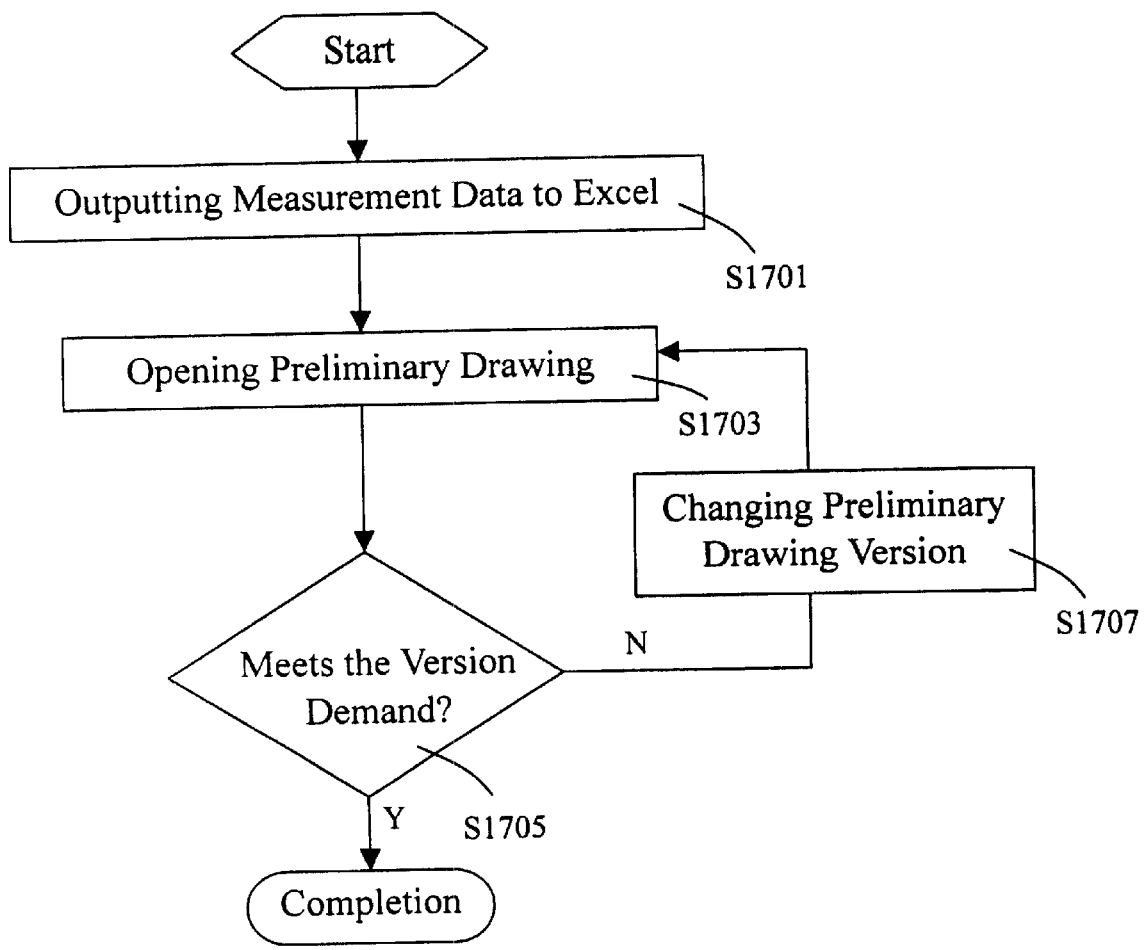
FIG. 17 is a flow chart of details of one of the steps of FIG. 16, namely obtaining relevant data.

FIG. 17 is a flow chart of details of step S1601 of FIG. 16, namely obtaining relevant data. After receiving the preliminary CAD drawing and the measurement data, in step S1701 the format changing sub-module 511 outputs the measurement data to the measurement sheet of the Excel book. In step S1703, the graphic file processing sub-module 512 opens the preliminary CAD drawing. In step S1705, the graphic file processing sub-module 512 checks whether the preliminary CAD drawing meets the version demand. If the preliminary CAD drawing does not meet the version demand, then in step S1707 the graphic file processing sub-module 512 advises the user to change the version of the preliminary CAD drawing. If and when the preliminary CAD drawing meets the version demand, the procedure is completed.

Figure 18:
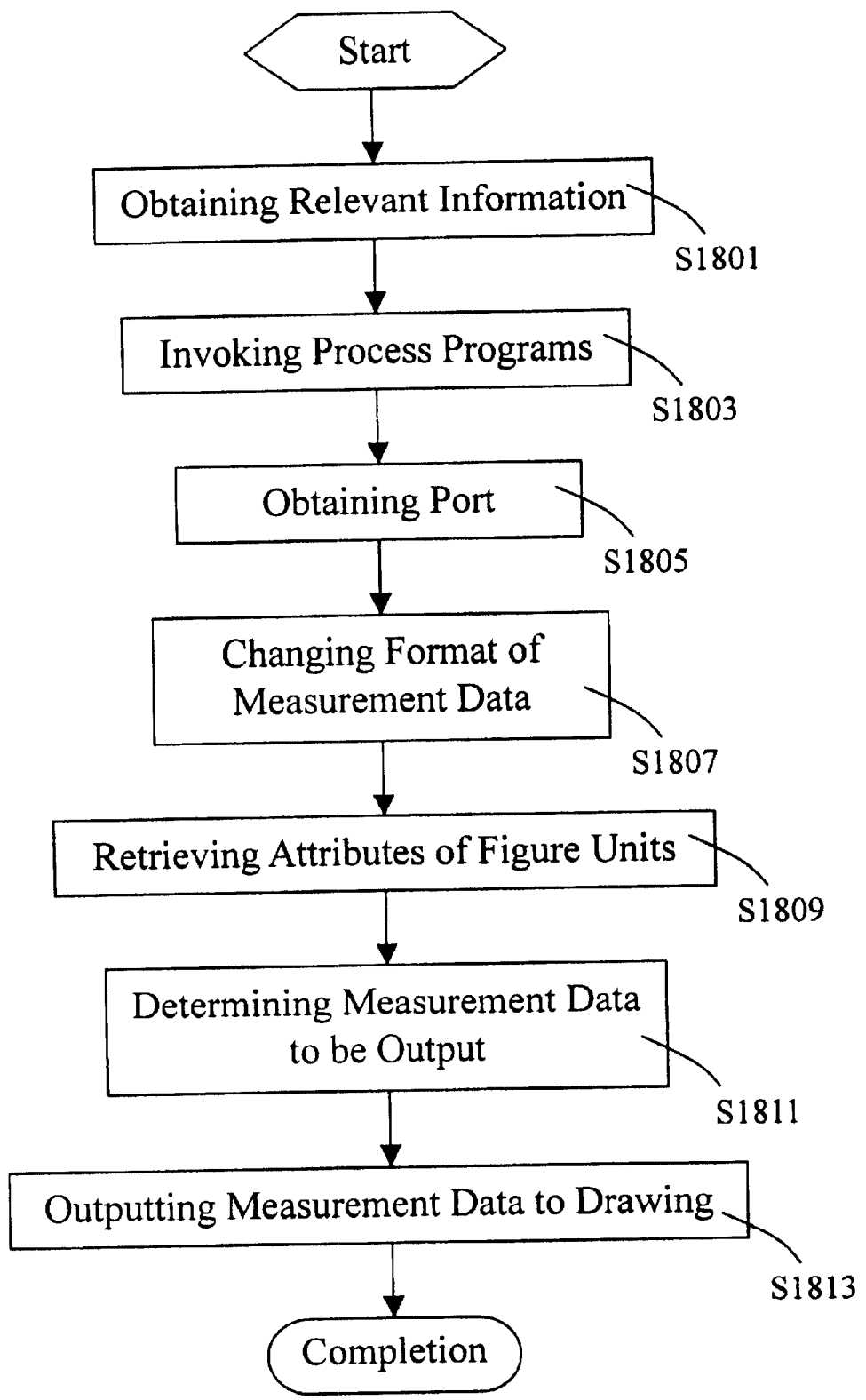
FIG. 18 is a flow chart of details of another of the steps of FIG. 16, namely executing one or more process programs for outputting measurement data to a preliminary CAD drawing.

FIG. 18 is a flow chart of details of step S1603 of FIG. 16, namely executing one or more process programs for outputting the measurement data to the preliminary CAD drawing. Firstly, in step S1801, the information gathering sub-module 521 obtains the measurement data from the measurement sheet of the Excel book and the preliminary CAD drawing from the data obtaining module 510, and also other information input by the user. The other information input by the user comprises a column recording the measurement data, a column recording the figure number process programs to be invoked, color of lead lines, color of measurement data, and color of any measurement that exceeds a design tolerance. In step S1803, the program invoking sub-module 522 invokes various process programs according to the user's demands regarding a manner in which measurement data is to be output. In the preferred embodiment of the present invention, when an object is measured, it is measured many times in order to improve precision of measurement. Thus many groups of measurement data on the object are created. According to the particular demand of the user, the measurement data outputting subsystem 180 can output one group of measurement data on the object to the CAD drawing of the object, or output all groups of measurement data on the object to the CAD drawing, or output a group of measurement data which is most different from design dimensions of the object to the CAD drawing. In the preferred embodiment of the present invention, three process programs are provided according to the foregoing three particular demands: a one input/one output program, a multiple input/multiple output program, and a multiple input/worst output program. The one input/one output program is used for outputting one group of measurement data on an object to the CAD drawing. The multiple input/multiple output program is used for outputting more than one group of measurement data on an object to the CAD drawing. The multiple input/worst output program is used for outputting a group of measurement data which is most different from design dimensions of the object to the CAD drawing. Then in step S1805 the port capturing sub-module 523 obtains a communication port between the measurement data and the CAD drawing, through which the measurement data can be output to the CAD drawing. In step S1807, the attribute changing sub-module 524 changes non-text format measurement data into text format measurement data that is in accordance with a format of the CAD drawing. In step S1809, the attribute retrieving sub-module 525 retrieves attributes of figure units in the CAD drawing. In step S1811, the analyzing and calculating sub-module 526 obtains links between data in the measurement sheet of the Excel book and the attributes of the figure units in the CAD drawing, and determines measurement data to be output to the CAD drawing. Finally, in step S1813, the dimension data outputting sub-module 527 outputs the determined measurement data to the CAD drawing.

Figure 19:
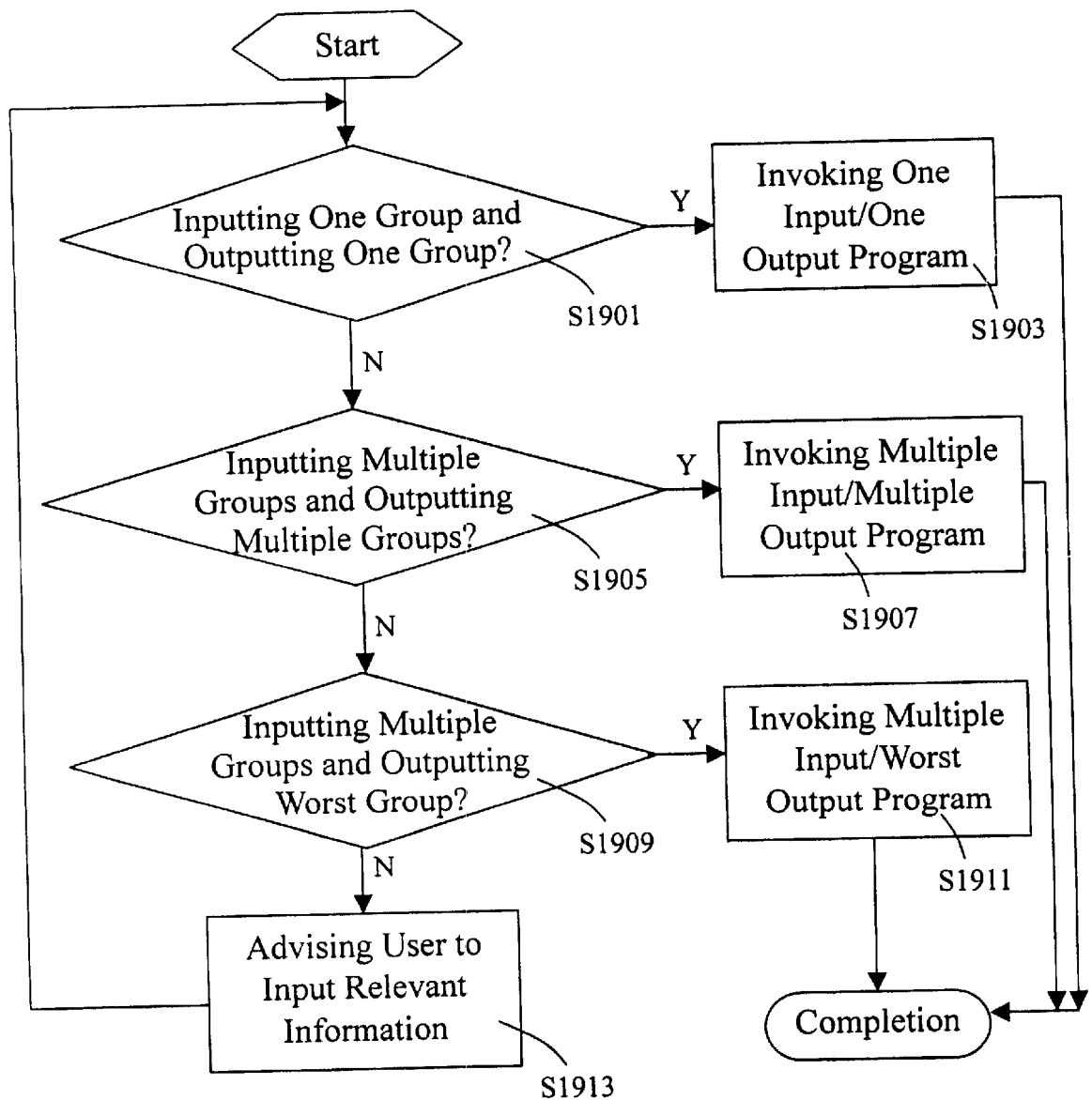
FIG. 19 is a flow chart of details of one of the steps of FIG. 18, namely invoking various process programs according to a user's demands regarding a manner in which measurement data is to be output.

FIG. 19 is a flow chart of details of step S1803 of FIG. 18, namely invoking various process programs according to the user's demands regarding a manner in which measurement data is to be output. Firstly, in step S1901, the program invoking sub-module 522 determines whether the user wants to input one group of measurement data and output one group of measurement data, according to the information input by the user. If the user wants to input one group of measurement data and output one group of measurement data, then in step S1903 the program invoking sub-module 522 invokes the one input/one output program. Otherwise, in step S1905 the program invoking sub-module 522 determines whether the user wants to input more than one group of measurement data and output more than one group of measurement data, according to the information input by the user. If the user wants to input more than one group of measurement data and output more than one group of measurement data, then in step S1907 the program invoking sub-module 522 invokes the multiple input/multiple output program. Otherwise, in step S1909 the program invoking sub-module 522 determines whether the user wants to input more than one group of measurement data and output a group of measurement data which is most different from design dimensions ("worst"), according to the information input by the user. If the user wants to input more than one group of measurement data and output a group of measurement data which is most different from design dimensions, then in step S1911 the program invoking sub-module 522 invokes the multiple input/worst output program. Otherwise, the program invoking sub-module 522 advises the user to input relevant information which the process programs can process (step S1913).

Figure 20:
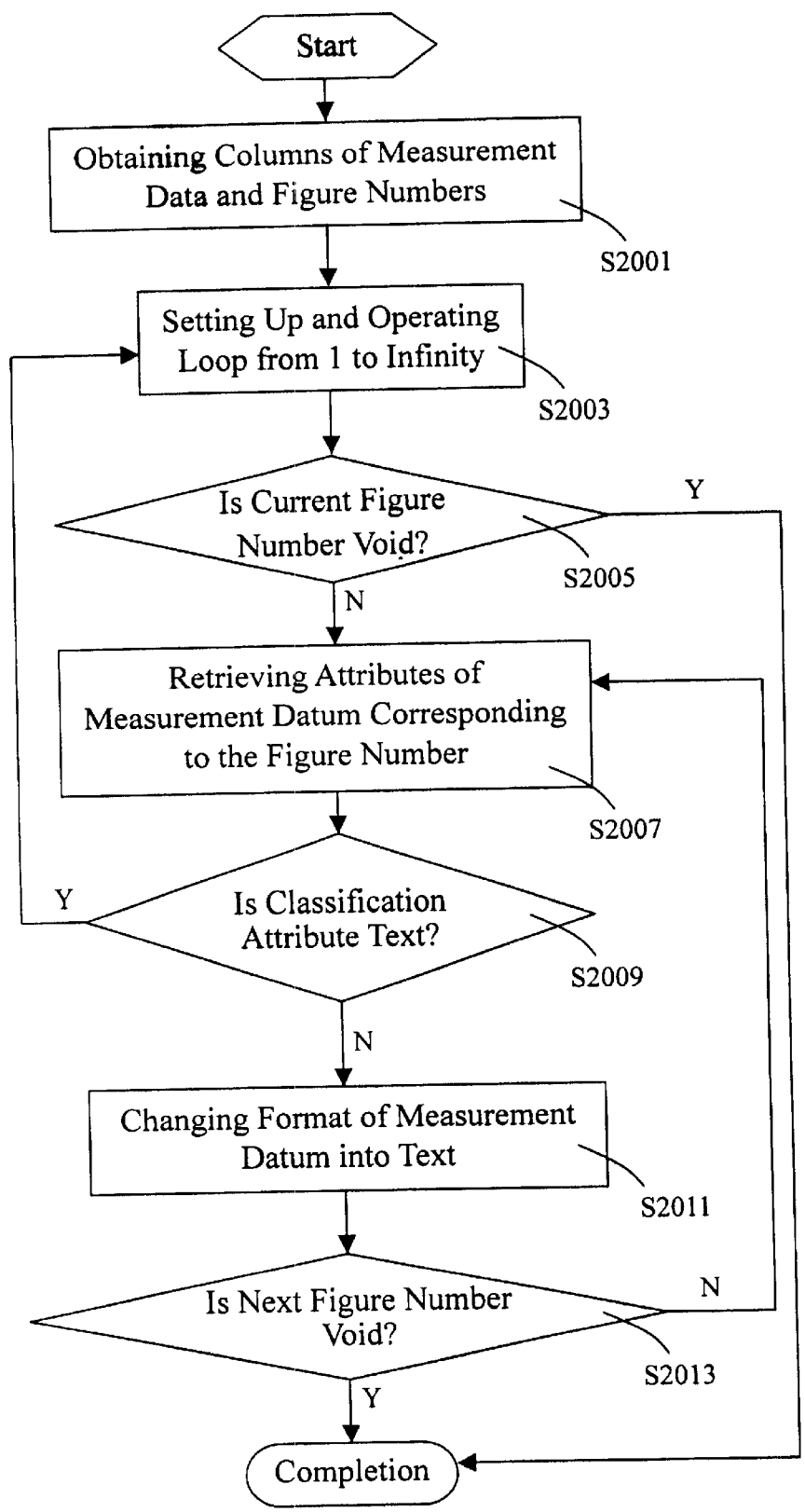
FIG. 20 is a flow chart of details of another of the steps of FIG. 18, namely changing non-text format measurement data into text format measurement data that is in accordance with a format of a CAD drawing.

FIG. 20 is a flow chart of details of step S1807 of FIG. 18, namely changing non-text format measurement data into text format measurement data that is in accordance with a format of the CAD drawing. Firstly, in step S2001, the attribute changing module 524 retrieves columns recording the measurement data and the figure numbers. In step S2003, the attribute changing module 524 sets up a loop from one to infinity, and operates the loop. In step S2005, for each loop value, the attribute changing module 524 determines whether a value in the current figure number column whose number is equal to the loop value is void. If the value is void, then the loop is terminated. If the value is not void, then in step S2007 the attribute changing sub-module 524 retrieves the attributes of the measurement datum corresponding to the figure number. In step S2009, the attribute changing sub-module 524 determines whether a classification attribute of the measurement datum is text. If the classification attribute of the measurement datum is text, then the attribute changing sub-module 524 runs a next loop according to step S2003 and the following applicable steps. Otherwise, in step S2011 the attribute changing sub-module 524 changes a format of the measurement datum into text format. In step S2013, the attribute changing sub-module 524 determines whether a value in a next figure number column whose number is equal to the loop value is void. If the value is not void, then the attribute changing sub-module 524 returns to step S2007 and continues to operate according to the applicable above-described steps. If the value is void, then the loop is terminated.

Figure 21:
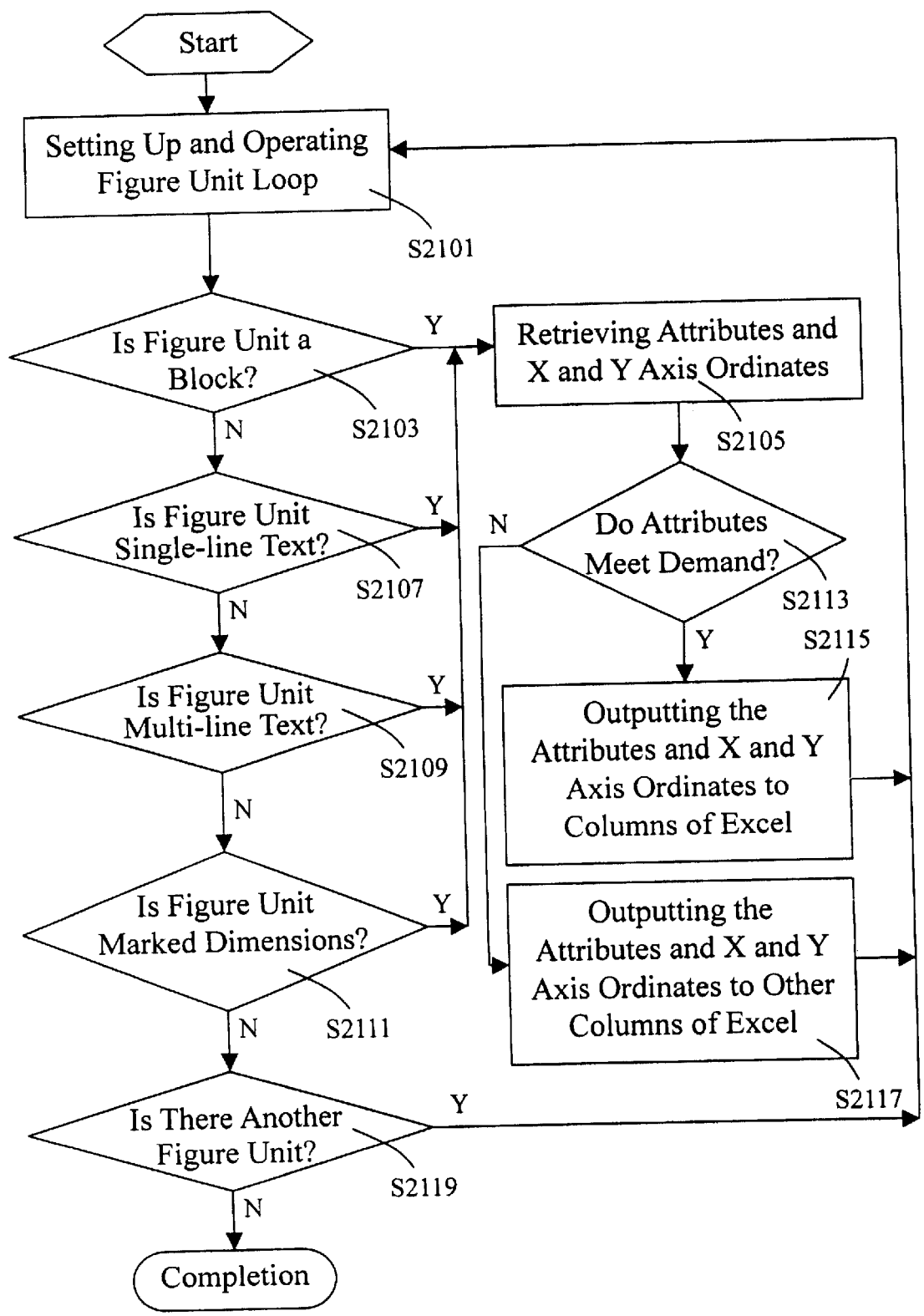
FIG. 21 is a flow chart of details of still another of the steps of FIG. 18, namely retrieving attributes of figure units in the CAD drawing.

FIG. 21 is a flow chart of details of step S1809 of FIG. 18, namely retrieving attributes of figure units in the CAD drawing. Firstly, in step S2101, the attribute retrieving sub-module 525 sets up a figure unit loop for enumerating all figure units in the CAD drawing, and then operates the loop. When a figure unit is enumerated, in step S2103 the attribute retrieving sub-module 525 determines whether the figure unit is a block. If the figure unit is a block, then in step S2105 the attribute retrieving sub-module 525 retrieves block attributes, an X-axis ordinate value and a Y-axis ordinate value of the figure unit. If the figure unit is not a block, then in step S2107 the attribute retrieving sub-module 525 determines whether the figure unit is single-line text. If the figure unit is single-line text, then in step S2105 the attribute retrieving sub-module 525 retrieves single-line text attributes, an X-axis ordinate value and a Y-axis ordinate value of the figure unit. If the figure unit is not single-line text, then in step S2109 the attribute retrieving sub-module 525 determines whether the figure unit is multi-line text. If the figure unit is multi-line text, then in step S2105 the attribute retrieving sub-module 525 retrieves multi-line text attributes, an X-axis ordinate value and a Y-axis ordinate value of the figure unit. If the figure unit is not multi-line text, then in step S2111 the attribute retrieving sub-module 525 determines whether the figure unit is marked dimensions. The marked dimensions comprise radial dimensions, diametric dimensions and angular dimensions. If the figure unit is marked dimensions, then in step S2105 the attribute retrieving sub-module 525 retrieves marked dimension attributes, an X-axis ordinate value and a Y-axis ordinate value of the figure unit. Once the attributes, X-axis ordinate value and Y-axis ordinate value of any figure unit are retrieved, in step S2113 the attribute retrieving sub-module 525 determines whether the attributes meet a predetermined demand. In the preferred embodiment of the present invention, the predetermined demand is that classification attributes of the figure unit are digital, and that the value of the figure unit is less than 5000. If the attributes of the figure unit meet the demand, then in step S2115 the attribute retrieving sub-module 525 inputs the attributes, the X-axis ordinate value and the Y-axis ordinate value of the figure unit into columns A, B and C respectively in an attribute sheet of the Excel book. If the attributes of the figure unit do not meet the demand, then in step S2117 the attribute retrieving sub-module 525 inputs the attributes, the X-axis ordinate value and the Y-axis ordinate value of the figure unit into columns D, E and F respectively in the attribute sheet of the Excel book. Then the attribute retrieving sub-module 525 returns to step S2101 and enumerates a next figure unit in the CAD drawing according to the figure unit loop.

In step S2111, if the figure unit is not marked dimensions, then in step S2119 the attribute retrieving sub-module 525 ascertains whether there is another figure unit in the CAD drawing. If there is another figure unit in the CAD drawing, then in step S2101 again the attribute retrieving sub-module 525 enumerates a next figure unit in the CAD drawing. Otherwise, the procedure of retrieving attributes of figure units in the CAD drawing is completed.

Figure 22:
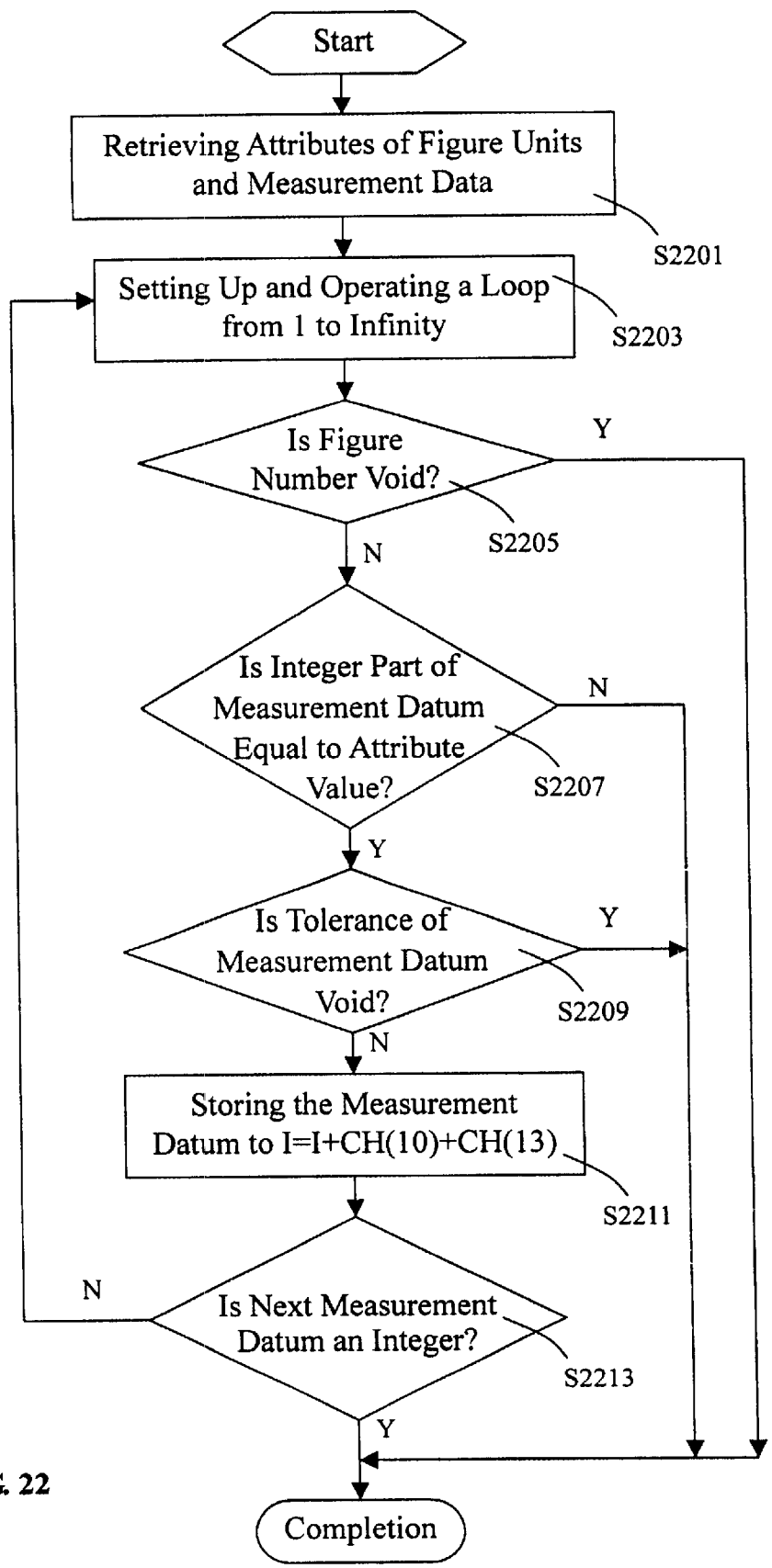
FIG. 22 is a flow chart of details of yet another of the steps of FIG. 18, namely determining measurement data to be output.

FIG. 22 is a flow chart of details of step S1811 of FIG. 18, namely determining measurement data to be output. Firstly, in step S2201, the analyzing and calculating sub-module 526 retrieves the attributes of the figure units in the attribute sheet of the Excel book and the measurement data obtained by the information gathering sub-module 521. In step S2203, the analyzing and calculating sub-module 526 sets a loop from one to infinity, and operates the loop. In step S2205, the analyzing and calculating sub-module 526 determines whether a figure number value in the first column in the measurement sheet of the Excel book is void. If the value is void, then the loop is terminated. If the value is not void, then in step S2207 the analyzing and calculating sub-module 526 determines whether an integer part of the measurement datum in the first column is equal to an attribute value of any figure unit. In the preferred embodiment, all attribute values are respectively pre-set according to the design dimensions of the object. If the integer part of the measurement datum in the first column is equal to an attribute value of any figure unit, then in step S2209 the analyzing and calculating sub-module 526 determines whether the tolerance of the measurement datum is void. If the tolerance of the measurement datum is void, then the loop is terminated. If the tolerance of the measurement datum is not void, then in step S2211 the analyzing and calculating sub-module 526 determines that the measurement datum is to be output to the CAD drawing, and stores the measurement datum to a variable I=I+CH(10)+CH(13) in a preliminary measurement sheet of the Excel book. In this formula, 'I' represents the measurement datum, 'CH(10)' represents a space, and 'CH(13)' represents an "enter" operation. After storing the measurement datum, in step S2213, the analyzing and calculating sub-module 526 checks whether a next measurement datum is an integer. If the next measurement datum is an integer, then the procedure is completed. Otherwise, the analyzing and calculating sub-module 526 checks the next measurement datum according to step S2203 and the applicable foregoing steps.

Figure 23:
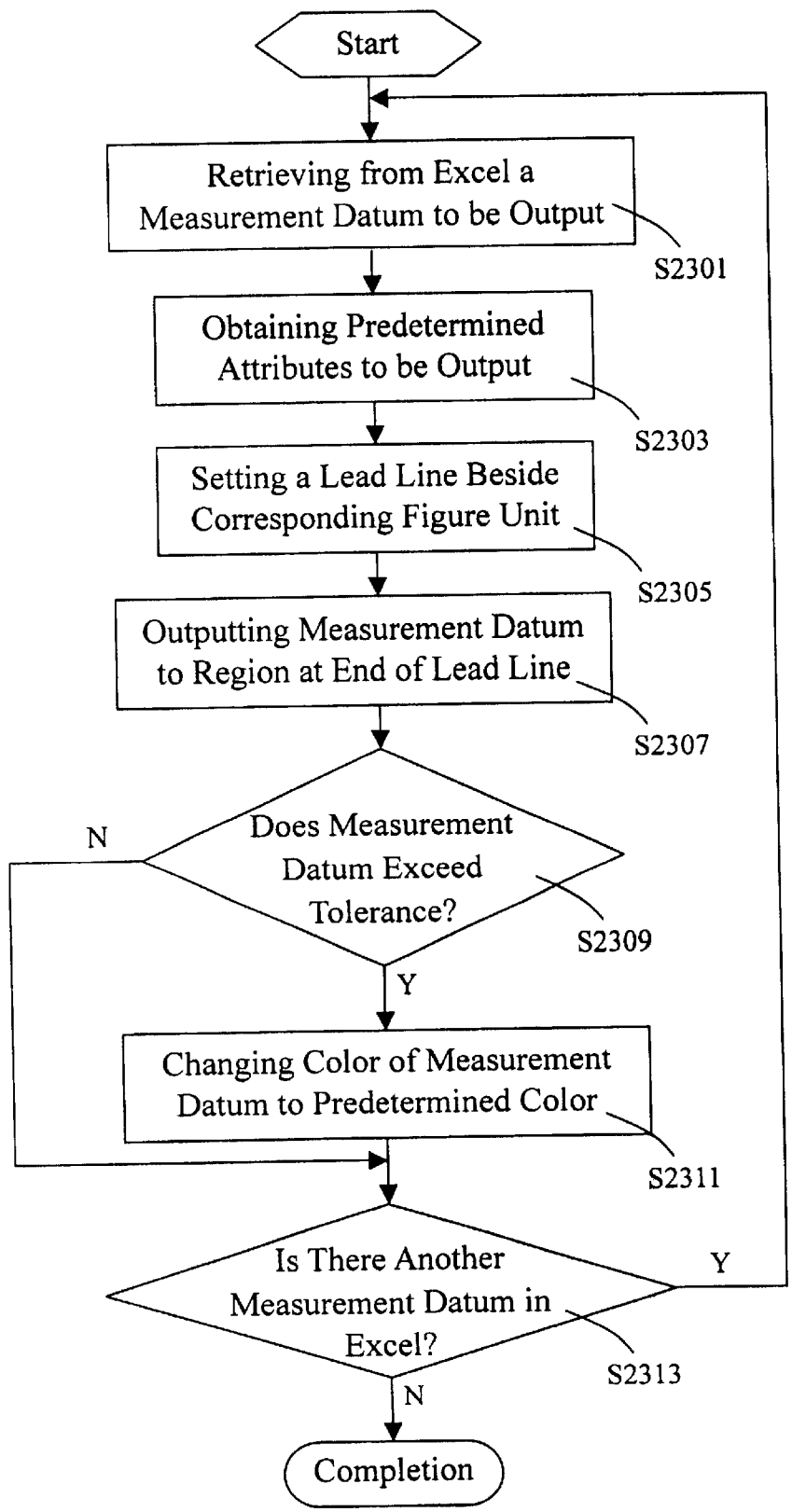
FIG. 23 is a flow chart of details of still yet another of the steps of FIG. 18, namely outputting measurement data to the CAD drawing.
Figure 24:
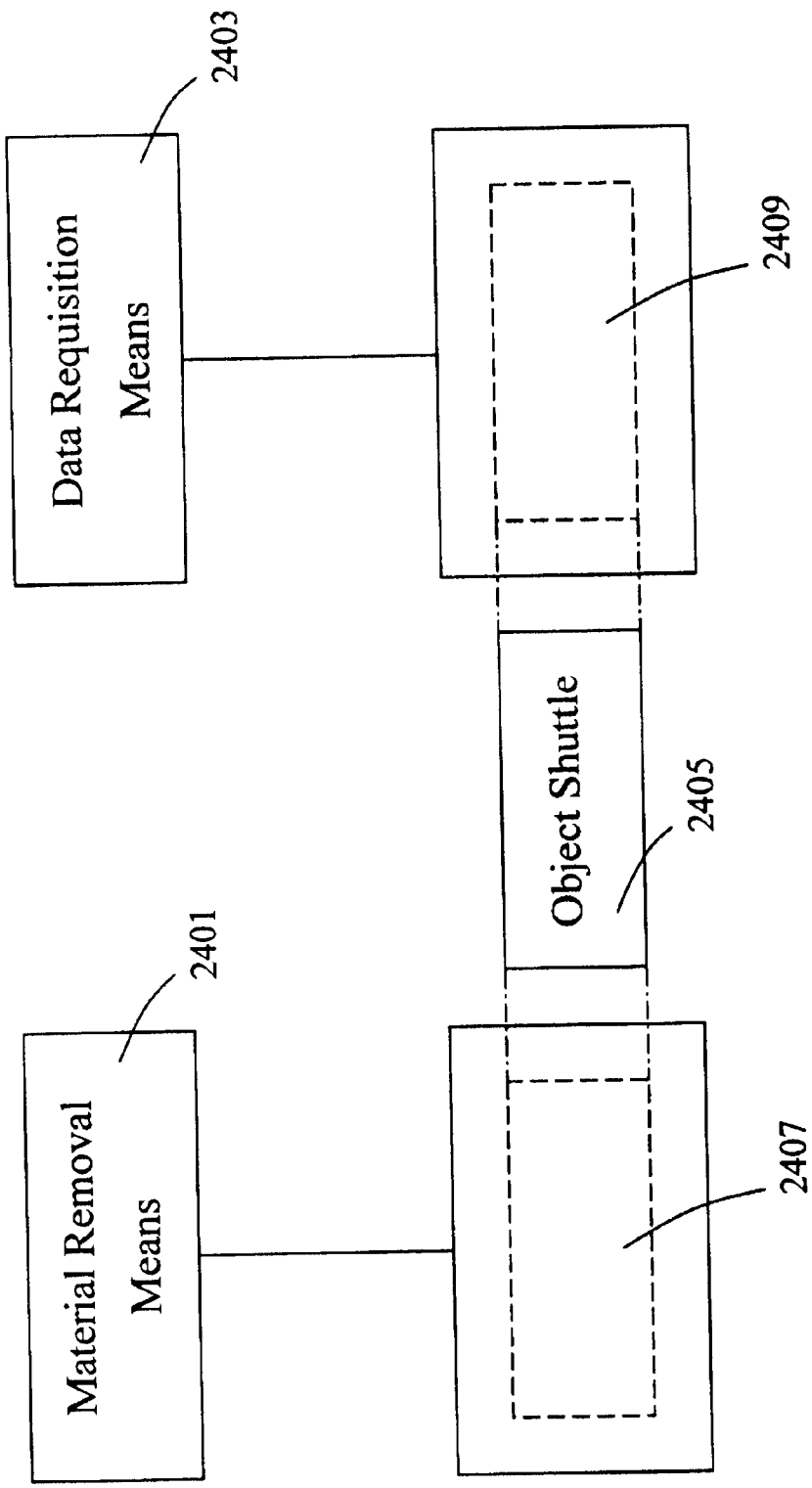
FIG. 24 is a schematic diagram of infrastructure of a conventional apparatus for creating three-dimensional modeling data on an object.

FIG. 23 is a flow chart of details of step S1813 of FIG. 18, namely outputting measurement data to the CAD drawing. Firstly, in step S2301, the dimension data outputting sub-module 527 retrieves a measurement datum from the preliminary measurement sheet of the Excel book. In step S2303, the dimension data outputting sub-module 527 obtains certain predetermined attributes of the measurement datum to be output. Such predetermined attributes include color of lead line, color of measurement datum, and color of any measurement that exceeds a design tolerance. In step S2305, the dimension data outputting sub-module 527 sets a lead line beside a figure unit that is to have the measurement datum input thereto. In step S2307, the dimension data outputting sub-module 527 outputs the measurement datum of the figure unit determined by the analyzing and calculating sub-module 526 to a region at an end of the lead line. In step S2309, the dimension data outputting sub-module 527 determines whether the measurement of the figure unit exceeds a tolerance of the design dimension thereof. If the measurement of the figure unit exceeds the tolerance of the design dimension thereof, then in step S2311 the dimension data outputting sub-module 527 changes a color of the measurement to the predetermined color that in dicates that the tolerance is exceeded. Otherwise, in step S2313 the dimension data outputting sub-module 527 checks whether there is another measurement datum in the preliminary measurement sheet of the Excel book. If there is another measurement datum in the preliminary measurement sheet of the Excel book, then the dimension data outputting sub-module 527 retrieves the measurement datum from the preliminary measurement sheet of the Excel book according to step S2301 and the applicable foregoing steps. Otherwise, the procedure is completed.

Although only preferred embodiments of the present invention have been described in detail above, those skilled in the art will readily appreciate that many modifications to the preferred embodiments are possible without materially departing from the novel teachings and advantages of the present invention. Accordingly, all such modifications are deemed to be covered by the following claims and allowable equivalents of the claims.

What is claimed is:

1. A system for analyzing and processing data on an object, the system comprising:
   an automatic scanning and measuring subsystem for obtaining point cloud data on the object and generating measurement data on the object by processing the point cloud data;
   a graphic file receiving apparatus for receiving a graphic file of the object;
   a dimension capturing subsystem for retrieving design dimensions from the graphic file;
   a report generating subsystem for generating a dimension report by combining the measurement data and the design dimensions; and
   a measurement data outputting subsystem for outputting the measurement data to the graphic file.

2. The system for analyzing and processing data as claimed in claim 1, wherein the automatic scanning and measuring subsystem comprises a point cloud receiving module for obtaining the point cloud data on the object.

3. The system for analyzing and processing data as claimed in claim 1, wherein the automatic scanning and measuring subsystem comprises a file changing module for converting the point cloud data on the object into data which can be identified by a computer.

4. The system for analyzing and processing data as claimed in claim 1, wherein the automatic scanning and measuring subsystem comprises an object assessing module for querying whether there is a program available for measuring the object.

5. The system for analyzing and processing data as claimed in claim 1, wherein the automatic scanning and measuring subsystem comprises an object measuring module for obtaining measurement data on the object.

6. The system for analyzing and processing data as claimed in claim 1, wherein the dimension capturing subsystem comprises a graphic file management center for receiving, classifying and storing a graphic file of the object.

7. The system for analyzing and processing data as claimed in claim 1, wherein the dimension capturing subsystem comprises a graphic file processing center for collecting the design dimensions from the graphic file.

8. The system for analyzing and processing data as claimed in claim 1, wherein the dimension capturing subsystem comprises a dimension management center for managing the design dimensions of the object.

9. The system for analyzing and processing data as claimed in claim 1, wherein the report generating subsystem comprises a form management module for managing templates of reports.

10. The system for analyzing and processing data as claimed in claim 1, wherein the report generating subsystem comprises a report processing module for generating reports using the measurement data and the design dimensions of the object.

11. The system for analyzing and processing data as claimed in claim 1, wherein the report generating subsystem comprises a column management module for storing columns set according to templates of reports.

12. The system for analyzing and processing data as claimed in claim 1, wherein the measurement data outputting subsystem comprises a data obtaining module for gathering the measurement data and the graphic file.

13. The system for analyzing and processing data as claimed in claim 1, wherein the measurement data outputting subsystem comprises a data processing module for outputting the measurement data to the graphic file.

14. The system for analyzing and processing data as claimed in claim 1, wherein the graphic file is an electronic file.

15. A method for analyzing and processing data on an object, the method comprising the steps of:
   obtaining measurement data on the object by processing point cloud data on the object;
   receiving a graphic file of the object;
   retrieving design dimensions of the object from the graphic file;

generating a report employing the measurement data and the design dimensions; and outputting the measurement data to the graphic file.

16. The method for analyzing and processing data as claimed in claim 15, wherein the step of obtaining measurement data on the object by processing point cloud data on the object further comprises the steps of:

receiving the point cloud data;

converting the point cloud data into data which can be identified by a computer;

querying whether there is a program available for measuring the object; and executing the program to obtain the measurement data, if there is a program available; or advising a user to design a program for measuring the object, if there is no program available.

17. The method for analyzing and processing data as claimed in claim 15, wherein the step of retrieving design dimensions of the object from the graphic file further comprises the steps of:

obtaining the graphic file;

processing the graphic file to obtain the design dimensions; and storing the design dimensions.

18. The method for analyzing and processing data as claimed in claim 15, wherein the step of generating a report employing the measurement data and the design dimensions further comprises the steps of:

receiving a template of a report to be generated;

setting columns of the report according to the template;

receiving the measurement data and the design dimensions; and generating the report employing the measurement data and the design dimensions.

19. The method for analyzing and processing data as claimed in claim 15, wherein the step of outputting the measurement data to the graphic file further comprises the steps of:

obtaining the measurement data and the graphic file;

outputting the measurement data to the graphic file; and storing the graphic file incorporating the measurement data.

20. The method for analyzing and processing data as claimed in claim 15, further including the step of marking related portions or data if a difference between a measured value and a design dimension is over an allowable tolerance, as a reminder for improving manufacturing.

21. A method for analyzing and processing data on an object, the method comprising the steps of:

obtaining measurement data on the object by processing point cloud data on the object, comprising the sub-steps of:

receiving the point cloud data;

converting the point cloud data into data which can be identified by a computer;

querying whether there is a program available for measuring the object;

executing the program to obtain the measurement data, if there is a program available; or advising a user to design a program for measuring the object, if there is no program available;

receiving a graphic file of the object;

retrieving design dimensions of the object from the graphic file; and further including at least one of the following two steps:

generating a report employing the measurement data and the design dimensions; and outputting the measurement data to the graphic file.

* * * * *